(12) United States Patent
Kessler et al.

(10) Patent No.: US 11,499,621 B1
(45) Date of Patent: Nov. 15, 2022

(54) SYSTEMS AND METHODS FOR IN-SITU MONITORING OF GEARBOX

(71) Applicant: Metis Design Corporation, Boston, MA (US)

(72) Inventors: Seth S. Kessler, Newton, MA (US); Michael Borgen, Wilmington, MA (US); Christopher T. Dunn, Salem, MA (US); Joshua F. Kessler, Newton, MA (US); Sophie T. Berk, Newton, MA (US)

(73) Assignee: Metis Design Corporation, Boston, MA (US)

( * ) Notice: Subject to any disclaimer, the term of this patent is extended or adjusted under 35 U.S.C. 154(b) by 0 days.

(21) Appl. No.: 17/698,501

(22) Filed: Mar. 18, 2022

(51) Int. Cl.
 *G01M 13/00* (2019.01)
 *F16H 57/01* (2012.01)
 *G01M 13/021* (2019.01)
 *H01L 41/113* (2006.01)
 *F16H 61/00* (2006.01)

(52) U.S. Cl.
 CPC ......... *F16H 57/01* (2013.01); *F16H 61/0006* (2013.01); *G01M 13/021* (2013.01); *H01L 41/1132* (2013.01)

(58) Field of Classification Search
 CPC .. F16H 57/01; F16H 61/0006; G01M 13/021; H01L 41/1132
 See application file for complete search history.

(56) References Cited

U.S. PATENT DOCUMENTS

| | | | | |
|---|---|---|---|---|
| 8,181,528 | B2* | 5/2012 | Reed | G01N 29/262 |
| | | | | 73/598 |
| 8,777,800 | B2* | 7/2014 | Morel | B64C 27/12 |
| | | | | 702/56 |
| 11,220,999 | B1* | 1/2022 | Cheng | F03D 80/88 |
| 2011/0120209 | A1* | 5/2011 | Rose | G01H 11/08 |
| | | | | 73/40.5 A |
| 2014/0257714 | A1* | 9/2014 | Kiviniemi | G01H 1/003 |
| | | | | 702/33 |
| 2014/0363290 | A1* | 12/2014 | Jacobsen | F03D 15/10 |
| | | | | 416/61 |
| 2020/0103889 | A1* | 4/2020 | Cella | G05B 23/0297 |
| 2021/0270244 | A1* | 9/2021 | He | G01M 13/028 |

* cited by examiner

*Primary Examiner* — Max H Noori
*Assistant Examiner* — Masoud H Noori
(74) *Attorney, Agent, or Firm* — McCarter & English, LLP

(57) ABSTRACT

Systems and methods for in-situ monitoring of gearbox are provided. An example system includes a mounting plate coupled to a component within the gearbox and a transducer array having a plurality of piezoelectric transducers disposed thereon to ultrasonically obtain diagnostic information about one or more components in the gearbox. The plurality of piezoelectric transducers are in contact with a surface of one or more mechanical components within the gearbox. The system includes circuitry, at least a portion of which is mounted inside the gearbox, electrically couplable to the transducer array, the circuitry configured to direct an excitation signal to a selected piezoelectric transducer of the plurality of piezoelectric transducers, and direct a response received from one or more of the plurality of piezoelectric transducers in proximity to the selected piezoelectric transducer toward a processor programmed or configured to determine gearbox diagnostic information therefrom.

28 Claims, 14 Drawing Sheets

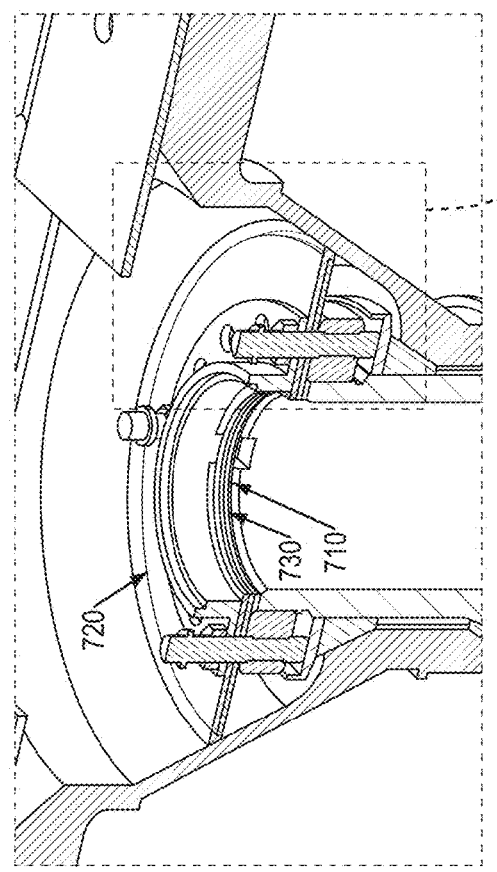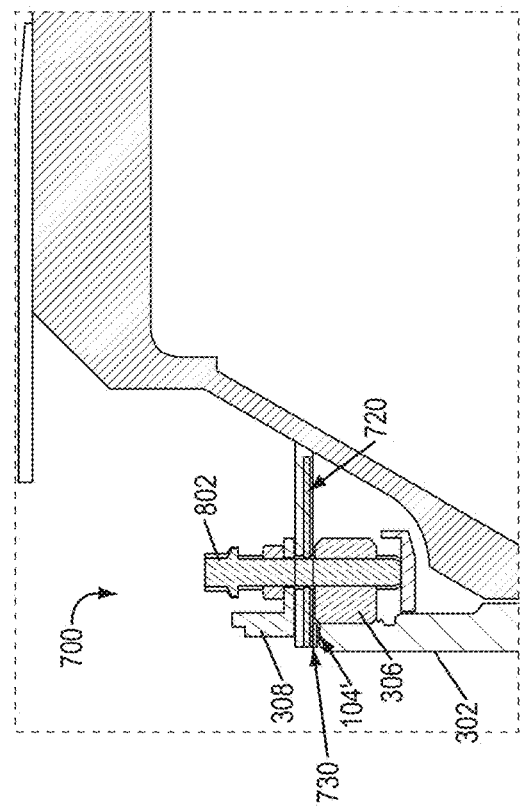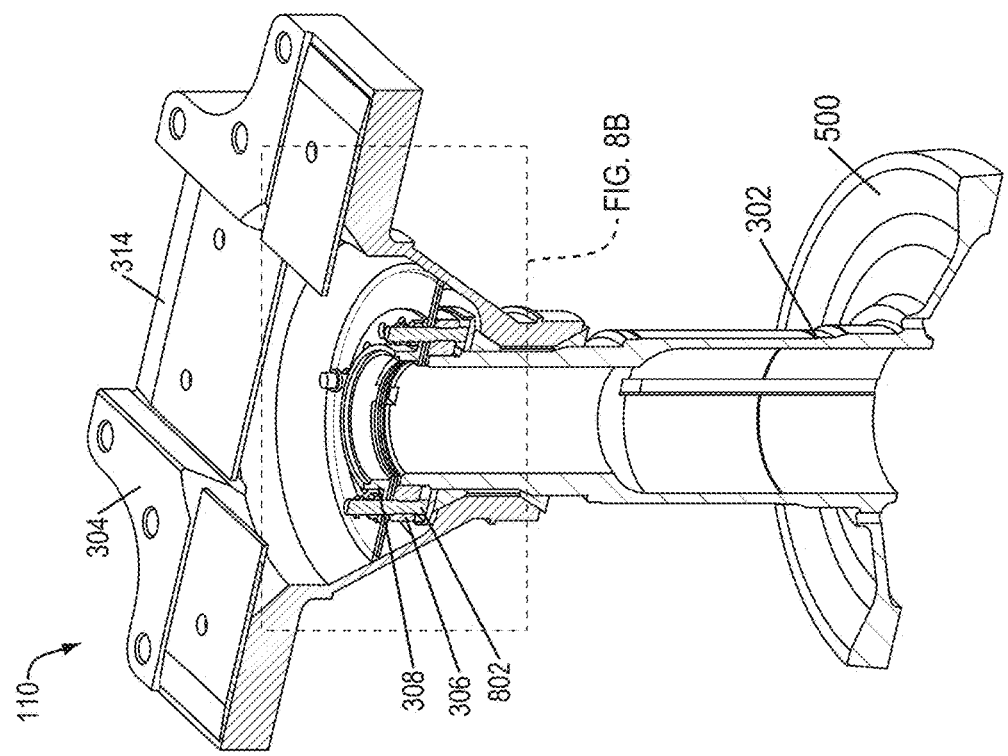

US 11,499,621 B1

SYSTEMS AND METHODS FOR IN-SITU MONITORING OF GEARBOX

STATEMENT OF GOVERNMENT INTEREST

This invention was made with Government support under Contract No. N68335-20-C-0858 awarded by the Naval Air Systems Command Small Business Innovation Research (SBIR) Program. The Government has certain rights in the invention.

BACKGROUND

A gearbox is commonly found in most turbomachinery applications, such as power generators and rotorcraft. Often, the gearbox is exposed to high degrees of strain, temperature, friction, and vibration, which often results in failure due to fatigue. Conventionally, disassembly of the gearbox is required to inspect for wear.

SUMMARY

The present disclosure relates to systems and methods for in-situ monitoring of a gearbox.

In one embodiment, the present disclosure provides an example system for in-situ monitoring of a gearbox. The system can include a mounting plate coupled to a component within the gearbox. The system can further include a transducer array having a plurality of piezoelectric transducers disposed on the mounting plate in a circular pattern with a substantially evenly spaced gap between one or more of the plurality of piezoelectric transducers. The transducer array is in contact with a surface of one or more mechanical components within the gearbox to ultrasonically obtain diagnostic information about the one or more mechanical components in the gearbox. The system further includes circuitry, at least a portion of which is mounted inside the gearbox, electrically couplable to the transducer array. The circuitry is configured to direct an excitation signal to a selected piezoelectric transducer of the plurality of piezoelectric transducers, and direct a response received from one or more of the plurality of piezoelectric transducers in proximity to the selected piezoelectric transducer toward a processor programmed or configured to determine the diagnostic information about the one or more mechanical components based at least in part on the response received from the one or more of the plurality piezoelectric transducer.

In another embodiment, the present disclosure provides an example method for in-situ monitoring of a gearbox. The method can include exciting a first piezoelectric transducer of a plurality of piezoelectric transducers to propagate an ultrasonic wave in one or more mechanical components within the gearbox. The plurality of piezoelectric transducers are disposed in a circular pattern on a mounting plate with a substantially evenly spaced gap between one or more of the plurality of piezoelectric transducers. The plurality of piezoelectric transducers are in contact with a surface of the one or more mechanical components within the gearbox to obtain diagnostic information about the one or more mechanical components. The method includes receiving at a first set of the plurality of piezoelectric transducers a first response of reflected waves excited by the ultrasonic wave propagated by the first piezoelectric transducer. The method includes, in response to receiving the first response of reflected waves, directing data toward a processor programmed to or configured to determine diagnostic information about the one or more components in the gearbox based at least in part on the first response reflected waves.

BRIEF DESCRIPTION OF THE DRAWINGS

The foregoing features of the present disclosure will be apparent from the following Detailed description of the present disclosure, taken in connection with the accompanying drawings, in which:

FIG. 8A is a cross-sectional view of an example rotorcraft tail gearbox integrated with the example system of FIG. 7A;

FIG. 8B is a zoomed-in view of a portion of FIG. 8A;

FIG. 8C is a zoomed-in view of a portion of FIG. 8B;

DETAILED DESCRIPTION

Figure 1A:
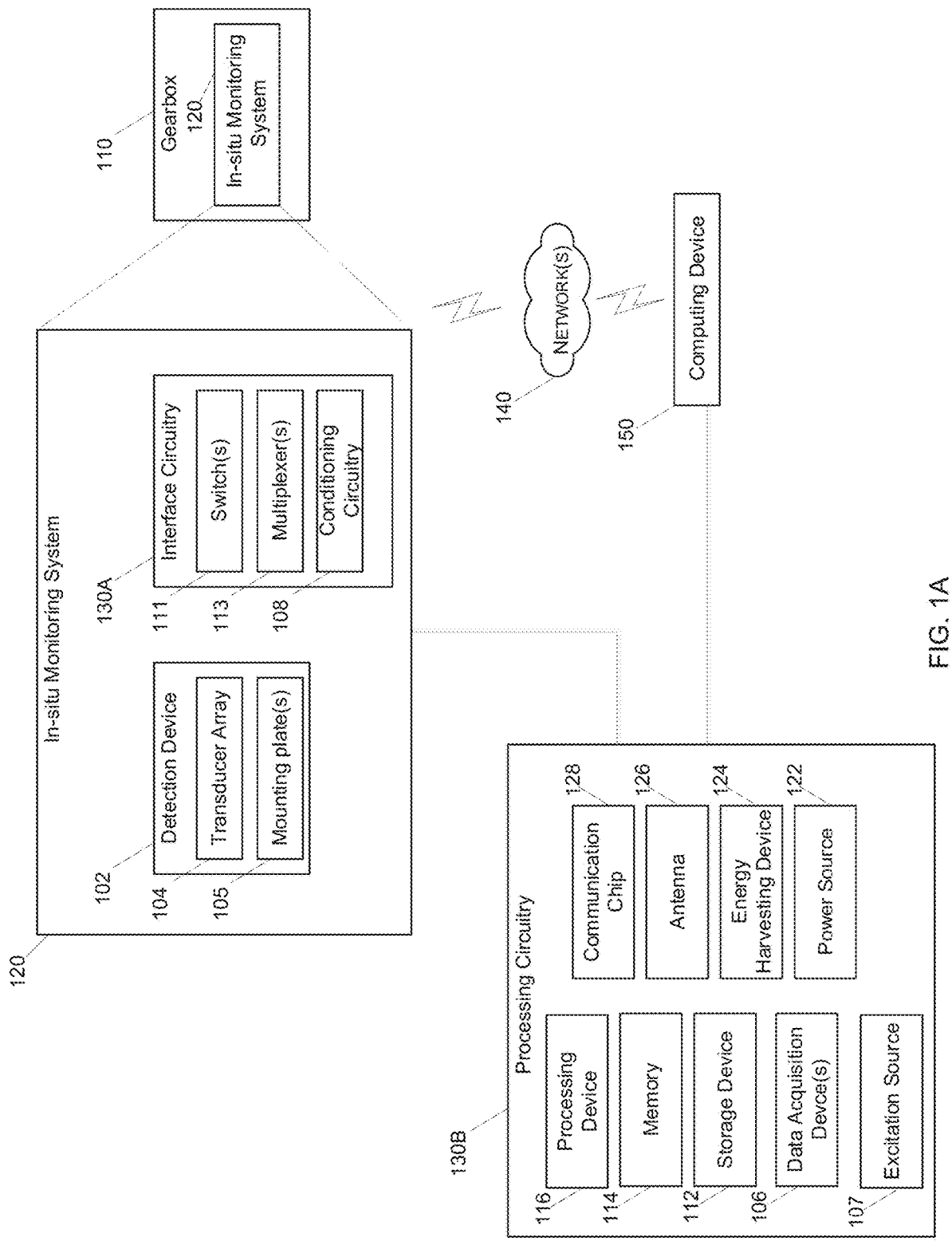
FIG. 1A is a block diagram of an example system for in-situ monitoring of a gearbox according to some embodiments of the present disclosure.

The present disclosure relates to systems and methods for in-situ monitoring of a gearbox or other enclosed mechanical apparatus or system. Example systems and methods are described in detail below in connection with FIGS. 1-12.

While mature inspection processes exist, they can be costly due to the need for disassembly to access the regions of the gearbox that need to be inspected. This disassembly process can also further make the gearbox susceptible to other forms of failure due to the need to break factory seals, the potential to disrupt critical alignment, the potential to introduce contaminate lubricants and/or moisture that can lead to corrosion. Further, the down-time caused by the disassembly and reassembly process could be a significant cost driver, for example for a helicopter fleet that requires a certain guaranteed level of aircraft availability. The present disclosure can monitor a gearbox without going through the processes of dissembling and reassembling the gearbox.

Example embodiments of an in-situ monitoring system disclosed herein are integrated with a gearbox (e.g., mounted inside the gearbox) to monitor conditions (e.g., fatigue, crack growth, structure damage, corrosion, level of bolt torque, imbalance, etc.) of various components of the gearbox without going through the processes of dissembling and reassembling the gearbox. As such, the in-situ monitoring systems as taught herein can reduce and/or avoid potential failures caused by the disassembly and reassembly processes that may break factory seals, disrupt critical alignments, and/or introduce contaminate to lubricants and/or moisture that can lead to corrosion. Further, the in-situ monitoring systems as taught herein can also reduce inspection cost and improve inspection efficiency. In some embodiments, the in-situ monitoring system can be formed or machined to substantially match the geometry of one or more components of the gearbox (e.g., a gear, a gear stem, a gear shaft, a retention plate, a bolt, a nut, etc.), and the in-situ monitoring system as taught herein can be mounted to the one or more components via existing fasteners (e.g., bolts) of the gearbox, and/or fasteners added to gearbox. In such way, the in-situ monitoring system as taught herein can be integrated into various types of gearboxes in different turbomachinery applications, such as power generators and rotorcraft without interfering with the operation and performance of the gearbox.

The in-situ monitoring systems taught herein can include a transducer array having multiple piezoelectric transducers (e.g., piezoelectric wafers). A piezoelectric transducer can serve as an ultrasonic transducer to send and/or receive wave energy (e.g., vibrations) during ultrasonic wave propagation across the gearbox components. The in-situ monitoring systems taught herein can further include a mounting plate configured to mount the transducer array inside the gearbox. The in-situ monitoring systems taught herein can utilize wireless communications to communicate with one or more computing devices (e.g., electronic devices, computers, laptops, etc.) that are external to the gearbox for transferring and/or exchanging data associated with the gearbox and/or for powering the in-situ monitoring systems taught herein. That is, the in-situ monitoring systems taught herein allow for inspection of one or more of the components that make up a gearbox without having to open the gearbox. Such wireless communications can overcome challenges caused by communications based on wires and/or cables in some applications that require high rotation speeds and/or sealed conditions. In some embodiments, the in-situ monitoring systems taught herein can utilize wired communications to communicate with one or more computing devices (e.g., electronic devices, computers, laptops, etc.) that are external to the gearbox for transferring and/or exchanging data associated with the gearbox and/or for powering the in-situ monitoring systems taught herein. That is, the in-situ monitoring systems taught herein allow for inspection of one or more of the components that make up a gearbox without having to open the gearbox.

Turning to the drawings, FIG. 1A is a block diagram of an example in-situ monitory system 120 (hereinafter referred to as "system 120") for in-situ monitoring of a gearbox 110 according to some embodiments of the present disclosure.

The gearbox 110 refers to a set of gears, which includes one or more gears and their casing, which is used to transfer energy from one rotating power source to another and can be found in turbomachinery, such as rotorcraft (e.g., a helicopter using a tail gearbox), power generators, automobiles, turbines, and heavy machinery. Those skilled in the art will appreciate that other mechanical components may be included in the gearbox such as drive shafts, fasteners, sleeves and the like. Examples of the gearbox 110 are described with respect to FIGS. 3-5, 8 and 9.

The system 120 includes a detection device 102 and interface circuitry 130A. The interface circuity 130A includes one or more switches 111, one or more multiplexers 113, and conditioning circuitry 108 and functions as an interface to the detection device 102 to control, condition and direct signals to and from the detection device 102. The system 120 can be interfaced with processing circuitry 130B that is external to the gearbox 110. The processing circuitry 130B includes a data acquisition device(s) 106, an excitation source 107, a storage device 112, memory 114, a processing device 116 (e.g., microcontroller or microprocessor), a power source 122, an energy harvesting device 124 (e.g., having power harvesting circuitry), an antenna 126, and a communication chip 128 (e.g., a radio frequency (RF) transceiver). In some embodiments, the communication chip 128 can be integrated into the antenna 126 and can receive or transmit signals in a wireless protocol or standard via the antenna 126. In some embodiments, the communication chip 128 can receive or transmit signals in wired formats, such as the RS232 standard, the universal serial bus (USB) standard, Ethernet standard, serial peripheral interface (SPI) protocol, hardware communication (UART) protocol, or the like. In some embodiments, the system 120 can include less or more components and/or devices. In some embodiments, part or all of a component/device can be integrated with another component/device. In some embodiments, the processing circuitry 130B can be embedded in the gearbox with the interface circuitry 130A. In some embodiments, the processing circuitry 130B can be a standalone system that interfaces with the interface circuitry 130A in the gearbox 110 via a wired or wireless interface from an environment external to the gearbox 110. In some embodiments the processing circuitry 130B can be part of a computational system, for example, computing device 150 that interfaces with the interface circuitry 130A in the gearbox 110 via a wired or wireless interface from an environment external to the gearbox 110.

The detection device 102 includes a transducer array 104 that has multiple piezoelectric transducers and/or conductive traces (e.g., flexible circuits) electrically coupled to the piezoelectric transducers. A piezoelectric transducer can serve as an ultrasonic transducer to send and/or receive wave energy (e.g., vibrations) during ultrasonic wave propagation across one or more gearbox components. The transducer array 104 uses the piezoelectric effect to measure changes in temperature, strain, vibration, oil quality used in the gearbox 110, acceleration, pressure, structural health, and other suitable physical parameters associated with the gearbox 110. The piezoelectric transducers (e.g., circular piezoelectric transducers or piezoelectric transducers having any suitable shapes, etc.) can be arranged at spaced intervals (e.g., evenly spaced intervals or irregularly spaced intervals between gear keyways) along the circumference of the gearbox components (e.g., gear stem, gear shaft, bolts, nuts, etc.) perpendicular/angled to a sidewall of the gearbox 110. In some embodiments, the piezoelectric transducers are arranged in a circular manner with substantially even spacing between each transducer in the circular pattern. The piezoelectric transducers can be arranged contiguously (e.g., adjacent to each other). The conductive traces of the transducer array 104 can include one or more flexible circuits and/or one or more printed circuit boards electrically coupled with each of the piezoelectric transducers. In some embodiments, the transducer array 104 can include a first flexible circuit and a second flexible circuit that are electrically coupled to the piezoelectric transducers and to the interface circuitry 130A (e.g., the conditioning circuity 108) or the processing circuitry 130B or both. The first flexible circuit is physically electrically coupled with each of the piezoelectric transducers and the surface of the one or more mechanical components, and the second flexible circuit is electrically coupled with each of the piezoelectric transducers and electrically coupled to the interface circuitry 130A or the processing circuitry 130B or both. The piezoelectric transducers are electrically coupled to the first flexible circuit via a first conductive material (e.g., solder, stiff and/or thin conductive epoxy, for example, a silver epoxy, etc.). The piezoelectric transducers are electrically coupled to the second flexible circuit via a second conductive material (e.g., soft and/or thick conductive adhesive, etc.). Examples are further described with respect to FIGS. 2A and 2B. In some embodiments, the transducer array 104 can include a printed circuit board and/or a flexible circuit. For example, a first side of each of the piezoelectric transducers is electrically coupled to the printed circuit board and a second side of each of the piezoelectric transducers is in contact with the surface of the one or more mechanical components in the gearbox. In another example, a first side of each of the piezoelectric transducers is electrically coupled to a first side of a flexible circuit, a second side of the flexible circuit is in contact with the surface of the one or more mechanical components in the gearbox, a second side of each of the plurality of piezoelectric transducers is electrically coupled with the printed circuit board. Examples are further described with respect to FIGS. 7A and 7B.

The transducer array 104 can ultrasonically obtain diagnostic information about one or more components in the gearbox 110. The diagnostic information relates to a bolt torque, a crack or a torque balance for a plurality of fasteners within the gearbox. In some embodiments, the transducer array 104 can be in contact, either directly or indirectly, with a surface of an internal part of the gearbox 110. The internal part can be in mechanically coupled with one or more components (e.g., gear stem, gear shaft, gear, mounting hardware) of the gearbox 110 such that ultrasonic energy propagates between the transducer array 104 and areas to be inspected without obstructions or holes or gaps. Advantageously, it is not necessary for the transducer array 104 to be in direct contact the area to be inspected. For example, the transducer array 104 can be in contact with a surface of a gear stem that is part of the same piece of metal containing a gear to inspect the gear. Examples of the transducer array 104 in contact with one or more mechanical components of the gearbox 110 are described with respect to FIGS. 2B and 7B.

In some embodiments, a dry couplant is used between one or more of the piezoelectric transducers and the gearbox component so that the coupling condition does not change over time due to the revolutions of a gear or other mechanical component in the gearbox and temperature. In some embodiments, a liquid form-in-place gasket or other casting material that starts out as amorphous to take the shape of the gearbox component and/or transducer surface roughness and geometry during assembly, but hardens into a semi-permanent, but removable, interface forms the dry couplant. In some embodiments, the transducer array 104 can be permanently bonded or mounted to the gearbox 110, for example, permanently bonded to a suitable component of the gearbox 110 (e.g., gear shaft, gear stem, mounting hardware, gear, etc.) using, for example, a permanent dry couplant (e.g., epoxy), or temporarily bonded or mounted to the gearbox 110 using gel couplants (e.g., ultrasound/acoustic gels or other suitable gel), or semi-permanently bonded or mounted to the gearbox 110 using semi-permanent casting material (e.g., form-in-place gasket material). For example, a dry couplant can be applied to conform to the transducer array 104 and, for example, the gear face to fill in air gaps, reducing reflection losses between interfaces. Some dry couplants (e.g., epoxy) can be permanently stable over time due to revolutions and temperature. Some dry couplants (e.g., form-in-place gasket material) can be stable over time and easily removable and replaced. For example, the transducer array 104 can be semi-permanently coupled to a suitable surface of a component in the gearbox 110 using a liquid form-in-place gasket material or other casting material that starts out as amorphous to take the shape of surface roughness and geometry of the gearbox 110 and/or the transducer array 104 during assembly, but will harden into a semi-permanent, but removable, interface. An example semi-permanent dry couplant can be polyvinyl siloxane (PVS) that is a two-part silicone rubber and cures in ten minutes at room temperature. During the assembly of the gearbox components, a dry couplant can be applied onto the circuitry (e.g., a flexible circuit) of transducer array 104, and can be left to cure under load. An example of implementing a dry couplant is described with respect to FIG. 6.

The detection device 102 can include one or more mounting plates 105. Each transducer in the transducer array 104 is mounted, directly or indirectly, to the mounting plate(s) 105 for the transducer array 104. The mounting plate(s) 105 can be configured to match the geometry of one or more components of the gearbox 110. In some embodiments, the mounting plate(s) 105 can be a washer (e.g., plastic or metal washer) that provides stiffness, mounting, and alignment features for temperature and chemical resistance. In some embodiments, the mounting plate(s) 105 can be a printed circuit board. Examples of the mounting plate(s) 105 are further described with respect to FIGS. 2A and 7A.

Several different ultrasonic inspection methods can be implemented with embodiments of the transducer array 104 to discover different types and locations of flaws in the gearbox 110, including bulk wave inspection, guided wave inspection, modal analysis, acoustic emission, impedance/admittance measurements and/or monitoring, combinations thereof, or the like (e.g., external or remote propagation sources). In some embodiments, the inspection can encompass areas directly surrounding the transducer array 104 and/or other areas having one or more gearbox components to be inspected (e.g., the gear, the stem, housing of the gearbox 110, and/or any suitable components within the gearbox 110). For some of the above inspection methods, the transducer array 104 can be used as a beamforming phased array, and in other cases the transducer array 104 can be used one at a time and/or in "pitch-catch" pairs. Data collected by the transducer array 104 can be recorded in time and/or frequency domains, including measurements of amplitude and phase. Example operations of the transducer array 104 are described with respect to FIG. 10.

The data acquisition device(s) 106 can collect, process, and transmit data received from the detection device 102 during or after excitation. The data collected and processed by the data acquisition device(s) 106 can be wired and/or wirelessly transmitted to the computing device(s) 150 using the antenna 126 and the communication chip 128 via a network(s) 140. In some embodiments, the data acquisition device(s) 106 can include one or more analog to digital conversion chips. In some embodiments, the data acquisition device(s) 106 can be electrically coupled to the detection device 102 such that the output of each of the piezoelectric transducers of the transducer array 104 can be received as an input to the data acquisition device(s) 106. Data from the detection device 102 can be transmitted in a wired and/or wireless manner or via traces on circuits to the data acquisition device(s) 106. In some embodiments, the data acquisition device(s) 106 can be mechanically coupled to or incorporated with the detection device 102. In some embodiments, one or more of the piezoelectric transducers of the transducer array 104 can be associated with one data acquisition device 106. In some embodiments, one or more data acquisition devices 106 can be associated with one of the piezoelectric transducers of the transducer array 104. After digitizing and processing the data from the detection device 102, the data can be transmitted to the processing device 116 and/or the computing device(s) 150 for further analysis.

The excitation source 107 can actuate the transducer array 104 via an electrical and/or mechanical stimuli (e.g., controlled by the processing device 116). For example, the excitation source 107 can include one or more digital to analog waveform generator chips, such as a digital to analog sine wave or arbitrary function generator. Signals output from the transducer array 104 in response to the excitation can be digitized by the analog-to-digital converter of the data acquisition device(s) 106 and subsequently processed by the processing device 116.

The conditioning circuitry 108 can receive as input the signal or signals from the transducer array 104, and can condition the signal or signals before it is input to the data acquisition device(s) 106. In some embodiments, the signal or signals from the transducer array 104 can be input to the data acquisition device(s) 106 without first being processed by the conditioning circuitry 108. The conditioning circuitry 108 can include an analog signal conditioning circuitry to process the signals/data received from the detection device 102. In some embodiments, the conditioning circuitry 108 can include a power protection circuit and filters for the data and power lines and amplifiers for the incoming and outgoing analog signals.

The storage device 112 can include any suitable, non-transitory computer-readable storage medium, e.g., read-only memory (ROM), erasable programmable ROM (EPROM), electrically-erasable programmable ROM (EEPROM), flash memory, and the like. In some embodiments, operations for controlling each of other components/devices of the system 120 can be embodied as computer-readable/executable program code stored on the non-transitory computer-readable storage device 112 and implemented using any suitable, high or low level computing language and/or platform, such as, e.g., Java, C, C++, C#, assembly code, machine readable language, and the like.

The memory 114 can include any suitable non-transitory computer-readable storage medium (e.g., random access memory (RAM), such as, e.g., static RAM (SRAM), dynamic RAM (DRAM), and the like). In some embodiments, the data/information and/or executable code for implementing an operation of the system 120 can be retrieved from the storage device 112 and copied to memory 114 during and/or upon implementation of the processes described herein. Once the data/information has be used, updated, modified, replaced, and the like, the data/information may be copied from the memory 114 to the storage device 112.

The processing device 116 can include any suitable single- or multiple-core microprocessor of any suitable architecture that is capable of implementing and/or executing operations of the system 120. For example, the processing device 116 can be programmed and/or configured to execute to excite the detection device 102, receive signals output from the detection device 102 (e.g., via the communication chip 128), and transmit or receive digitized data in a wireless protocol to or from an external device (e.g., the computing device 150) without having to break a seal of the gearbox 110. The processing device 116 can retrieve information/data from, and store information/data to, the storage device 112 and/or memory 114. For example, excitation signal values, received signal values, the diagnostic information associated with the gearbox 110, baseline values, values and/or any other suitable information/data for implementing the system 120 or that may be used by the system 120 may be stored on the storage device 112 and/or the memory 114.

In some embodiments, the processing device 116 can be programmed to control and supervise the system 120 to receive and process information/data/instructions/controls from the detection device 102, the data acquisition device(s) 106, the excitation source 107, the communication chip 128, and/or memory 114 and/or can be programmed to output information/data/instructions/controls to the communication chip 128, the storage device 112, and/or the memory 114 based on the execution of the system 120.

The power source 122 can be implemented as a battery or capacitive elements configured to store an electric charge. In some embodiments, the power source 122 can be a rechargeable power source, such as a battery or one or more capacitive elements configured to be recharged wirelessly from an external source via the energy harvesting device 124. In some embodiments, the rechargeable power source can be recharged using inductive coupling. Inductive coupling describes that power is transferred between a pair of inductive coils by a magnetic field. One of a pair of inductive coils can be a transmitting coil (also referred to as a transmitter coil, transmission coil, or primary coil). The other one of the pair can be a receiving coil (also referred to as a receiver coil or secondary coil). A transmitting coil is a coil having a varying current to produce a magnetic field that induces a varying electromotive force across a receiving coil such that an electric current is created in the receiving coil without a metallic or conductive connection between the transmitting coil and the receiving coil. A receiving coil refers to a coil receiving an electrical energy from the transmitting coil via a magnetic field induced by the transmitting coil. Power can be wirelessly transmitted by positioning the receiving and transmitting coils in close proximity to each other. In some embodiments, power can be transmitted by placing the transmitting coil into a pre-positioned mount in close proximity to the receiving coil. In some embodiments, power can be transmitted by placing the transmitting coil into close proximity to the receiving coil using a self-affixing strap to hold the transmitting coil in place. In some embodiments, the energy harvesting device 124 can include a receiving coil inside the gearbox 110. In some embodiments, the receiving coil can be mounted on a flexible circuit external to the housing of the gearbox 110.

In some embodiments, the rechargeable power source can be recharged through solar energy (e.g., by incorporating photovoltaic or solar cells as the energy harvesting device 124 to convert solar or thermal energy such as temperature and/or light to power energy), through physical movement (e.g., by incorporating piezoelectric elements as the energy harvesting device 124 to convert vibrational and strain-based movements to power energy), through energy received from radiofrequency transmissions (e.g., by the antenna 126 and/or by incorporating an antenna circuit as the energy harvesting device 124), and/or through any other suitable energy harvesting techniques. In some embodiments, the energy harvesting device 124 can be a device for harvesting radio frequency energy, inductive energy, mechanical energy, combinations thereof, or the like. The energy harvesting device 124 can include energy or power harvesting circuitry. The above wireless charging ways can overcome challenges caused by wires external to a gearbox that would need to rotate with one or more gears in the gearbox 110 (e.g., helicopter applications).

The communication chip 128 can be configured to transmit (e.g., via a transmitter of a radio frequency (RF) transceiver) and/or receive (e.g., via a receiver of an RF transceiver) wireless transmissions via the antenna 126. For example, the communication chip 128 can be configured to transmit data, directly or indirectly, to one or more external devices in a wireless protocol (e.g., the computing device(s) 150) and/or to receive data, directly or indirectly, from one or more external devices (e.g., the computing device(s) 150). The communication chip 128 can be configured to transmit and/or receive messages in a wireless from an environment external to the gearbox 110 having a specified frequency and/or according to a specified sequence and/or packet arrangement. As one example, the communication chip 128 can be a BlueTooth® transceiver configured to conform to a BlueTooth® wireless standard for transmitting and/or receiving short-wavelength radio transmissions typically in the frequency range of approximately 2.4 gigahertz (GHz) to approximately 2.48 GHz, including communications based on Bluetooth low energy (BLE) network technology. The communications based on BlueTooth® technology can be securely implemented with encryption and pairing features. As another example, the communication chip 128 can be a Wi-Fi transceiver (e.g., as defined IEEE 802.11 standards), which may operate in an identical or similar frequency range as BlueTooth®, but with higher power transmissions. As another example, the communication chip 128 can wirelessly transmit or receive data according to a proprietary communication and messaging protocol via the network 140. In some embodiments, the communication chip 128 can be implemented to include RF transceivers configured to transmit and/or receive transmissions according to the Zigbee® communication protocol, and/or any other suitable communication protocol.

The system 120 can communicate with the computing device(s) 150 via the network(s) 140 to transfer data to the computing device(s) 150, to receive data from the computing device(s) 150, and/or to receive power energy. The link between the system 120 and the computing device(s) 150 is a wired or wireless link.

The network(s) 140 can transmit and/or receive data and/or instructions via a network interface device/transceiver utilizing any one of a number of transfer protocols (e.g., frame relay, internet protocol (IP), transmission control protocol (TCP), user datagram protocol (UDP), hypertext transfer protocol (HTTP), etc.). Examples of the network(s) 140 can include a local area network (LAN), a wide area network (WAN), a packet data network (e.g., the Internet), mobile telephone networks (e.g., cellular networks), plain old telephone (POTS) networks, wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, and peer-to-peer (P2P) networks, among others. In an example, the network interface device/transceiver can include one or more physical jacks (e.g., Ethernet, coaxial, or phone jacks) or one or more antennas to connect to the network(s) 140. In an example, the network interface device/transceiver can include a plurality of antennas to wirelessly communicate using at least one of single-input multiple-output (SIMO), multiple-input multiple-output (MIMO), or multiple-input single-output (MISO) techniques. In some embodiments, the network interface device/transceivers can be included in the system 120 and the computing device(s) 150.

The computing device(s) 150 can be a device for transmitting data and/or power to the system 120, receiving data from the system 120, processing data and/or displaying data, or the like, such as, but not limited to, mobile devices (e.g., mobile phones), electronic devices (e.g., computers, tablets), and/or cloud computing devices (e.g., servers). For example, data can be received through a built in antenna in the computing device(s) 150 (e.g., mobile device), through a custom antenna coupled to the computing device(s) 150 as a USB-port dongle to serve as a communication (COM) port. The computing device(s) 150 can process data indicative of the diagnostic information using software, applications, and/or coded algorithms. The computing device(s) 150 can display the diagnostic information in real-time while providing power to the system 120 via the network(s) 140.

Figure 1B:
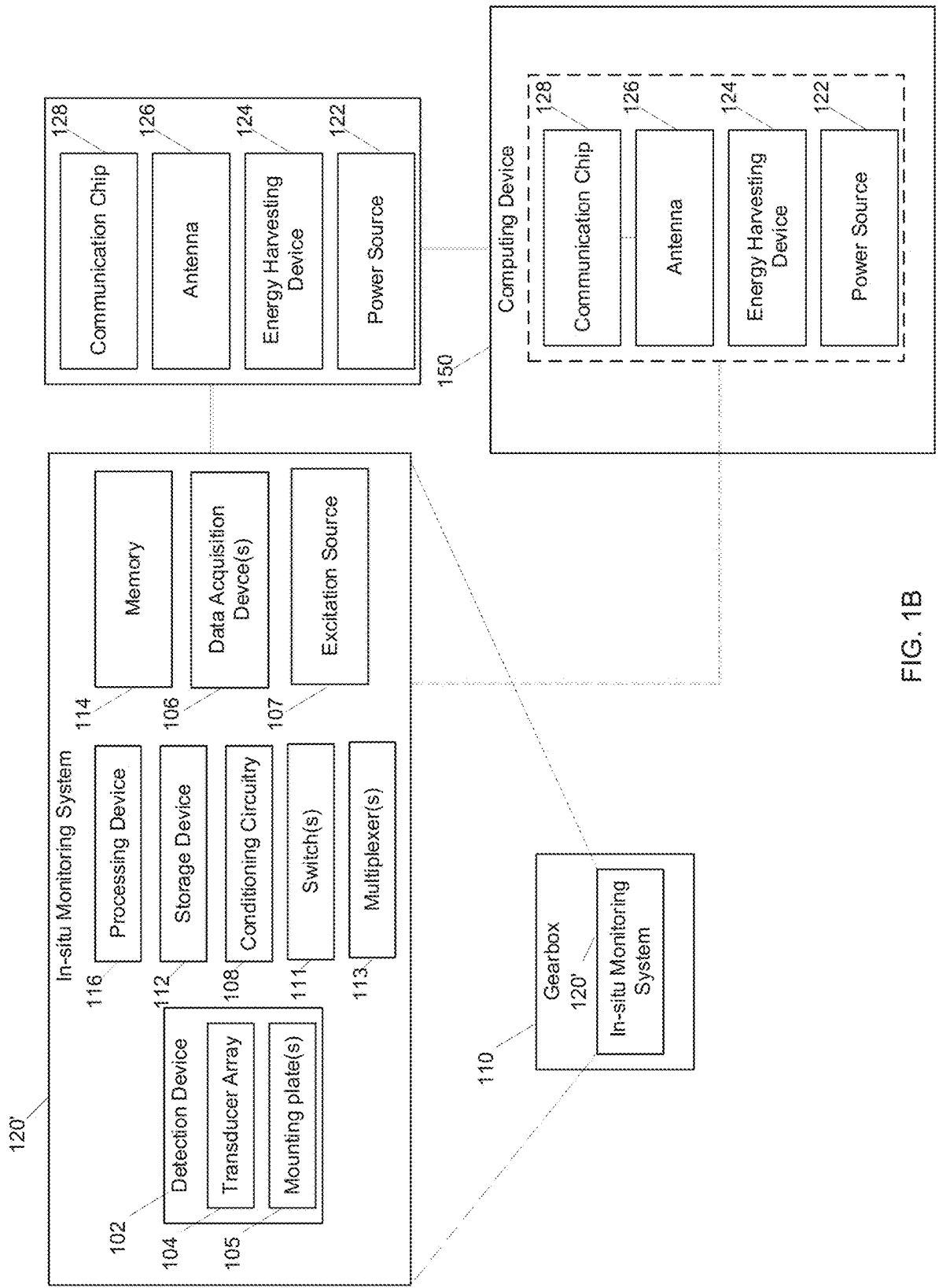
FIG. 1B is a block diagram of another example system for in-situ monitoring of a gearbox according to some embodiments of the present disclosure.

FIG. 1B is a block diagram of another example system 120' for in-situ monitoring of a gearbox according to some embodiments of the present disclosure. The system 120' includes the detection device 102, the data acquisition device(s) 106, the excitation source 107, the one or more switches 111, the storage device 112, the one or more multiplexers 113, the memory 114, the processing device 116. The power source 122, the energy harvesting device 124, the antenna 126, and the communication chip 128 are external to the gearbox 110 and are electrically coupled with the system 120'. These external components can be electrically coupled with the computing device 150 (as illustrated in solid lines). In some embodiments, these external components are embedded in the computing device 150 and electrically coupled with the computing device 150 (as illustrated in dash lines).

In some embodiments, an inductive power DC rectifier chip can be embedded inside the gearbox 110 integrated with the system 120'. The processing device 116 includes a built-in BLE capabilities. Embedding the inductive power DC rectifier chip and the processing device 116 inside the gearbox 110 can allow a remote BLE antenna and an inductive power receiving coil to be positioned outside the gearbox 110 using the limited number of wires or cables that can be placed into a channel that extends outside of the gearbox 110 (e.g., gutter, drainage, or the like) without modification. In this manner, the gearbox 110 can remain sealed and still allow for inspection of, diagnostics of, or both of components therein. For example, a remote BLE antenna 126 can be positioned on the outside of the gearbox 110 via a few traces and an inductive power receiving coil can be mounted on a flexible circuit external to the metallic gearbox housing.

In some embodiments, the antenna 126 and one or more coils can be located external to the housing or in some embodiments; all can be inside the gearbox 110. In some embodiments, the data transmission components (e.g., the communication chip 128, and/or other data transmission components) can be located inside the gearbox housing and the antenna 126 or one or more coils can be located external to the housing or in some embodiments, all are inside the gearbox 110. In some embodiments, some or components of the interface circuity 130A and/or the processing circuity 130B can be potted with urethane, conformal coating or soft epoxy to protect against fluids and mechanical loading. In some embodiments, the antenna 126 and/or coils for power distribution and data transmission can be located beneath a non-metallic protection layer such as a foam or rubber.

It should be understood that FIGS. 1A and 1B are merely one potential configuration, and the systems 120 and 120' of the present disclosure can be implemented using a number of different configurations.

FIGS. 2A-6 illustrate an example detection device of an example system for in-situ monitoring as taught herein. FIGS. 7A-9B illustrate another example system for in-situ monitoring system as taught herein. Those skilled in the art will appreciate that other embodiments are possible and that the in-situ monitoring system as taught herein is not limited to the embodiments illustrated herein.

Figures 2A, 2B:
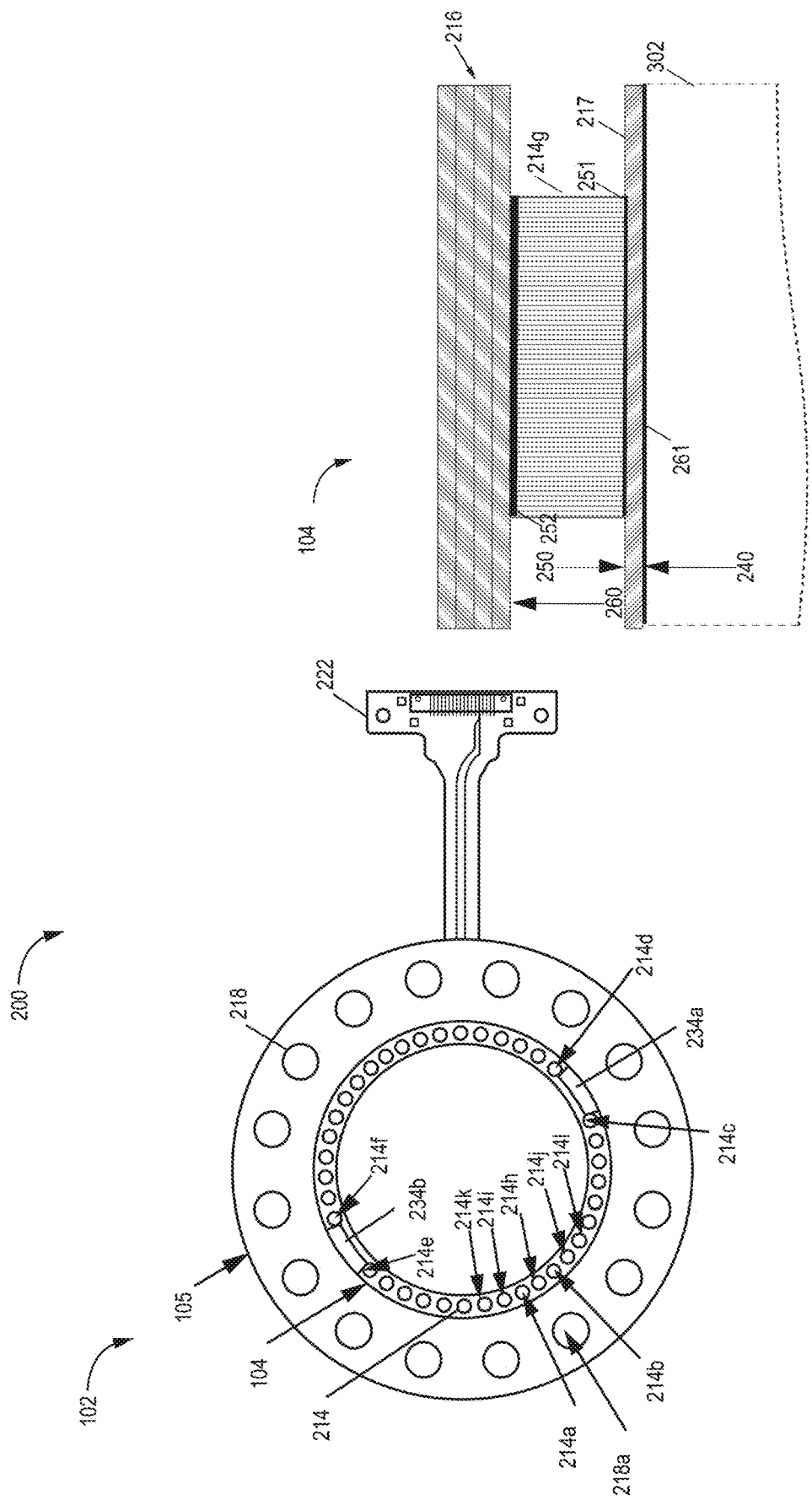
FIG. 2A illustrates an example detection device of an example system for in-situ monitoring of a rotorcraft tail gearbox according to some embodiments of the present disclosure.
FIG. 2B schematically illustrates a cross-sectional view of an example transducer array of FIG. 2A.

FIG. 2A illustrates the detection device 102 of an example in-situ monitoring system 200 (hereinafter referred to as "system 200") for in-situ monitoring of a rotorcraft tail gearbox according to some embodiments of the present disclosure.

The system 200 is one example embodiment of the systems 120 and/or 120'. The system 200 includes the detection device 102 and the printed circuit board 220 (shown in FIG. 2C) for implementing the interface circuitry 130A, the processing circuitry 130B or both. The detection device 102 includes a transducer array 104. The transducer array 104 includes multiple circular piezoelectric transducers 214 arranged in a circular pattern with substantially evenly spaced intervals between adjacent transducers 214. In some embodiments, a larger spacing between select transducers 214 may take place according to the geometry of the mechanical component being inspected, for example, between the gear keyways 234a and 234b. In some embodiments, the transducers 214 are placed in a circular fashion about the mounting plate 105 in any desired location on a surface of the mounting plate 105, for example, near or at an outer circumference of the mounting plate 105, near or at an inner circumference of the mounting plate, or near or at a midpoint circumference of the mounting plate 105. Those skilled in the art will appreciated that the mounting plate 105 can take any desired shape according to the size of the gearbox and the mechanical components therein.

In some embodiments, the transducer array 104 includes multiple circular piezoelectric transducers 214 arranged at intervals adjacent to apertures (e.g., for detecting level of bolt torque or imbalanced bolt torque), for example, a first piezoelectric element 214a and a second piezoelectric element 214b in front of or behind one of the apertures (e.g., an aperture 218a) to create a symmetrical positioning of the piezoelectric transducers 214 around a bolt or fastener associated with a respective aperture (e.g., the aperture 218a). Positioning of the piezoelectric transducers 214 in a symmetrical manner relative to the apertures allows for the ability to detect associated bolt or fastener torque. In some embodiments, the mounting plate 105 includes gear keyways 234a and 234b to facilitate alignment of the mounting plate 105 with another component in the gearbox, for example, a gear stem, a drive shaft. The angle between keyway-adjacent piezoelectric transducers (e.g., piezoelectric transducers 214c and 214d around the gear keyway 234a, or piezoelectric transducers 214e and 214f around the gear keyway 234b) can be greater than other evenly distributed piezoelectric transducers 214. The detection device 102 has a connector 222 to connect with the printed circuit board 220 (shown in FIG. 2C) for data transmission.

In some embodiments, one or more of the piezoelectric transducers 214 can be 0.125 inches in diameter and 0.02 inches in thickness of lead zirconate titanate (PZT) with the top and bottom plated with gold over nickel. Plated surfaces act as electrodes and can be flexible circuit attachment points. In some embodiments, as shown in FIG. 2A, thirty-eight piezoelectric transducers 214 are evenly distributed very 8.5° at a radius of 1.27" with the exception of the two gear keyways 234a and 234b. The angle between keyway-adjacent piezoelectric transducers can be 27°. It should be understood that parameters associated with the piezoelectric transducers 214 are not limited to the above values, but can be determined based at least in part on the geometry of the component in the gearbox 110 to which the piezoelectric transducers are mounted to, the size of each of the piezoelectric transducers 214 (e.g., larger size or smaller size), and other suitable factors that affect the distribution and the number of the piezoelectric transducers 214.

In some embodiments, the mounting plate 105 can be a plastic washer (e.g., made by polyetherimide materials). The mounting plate 105 can be mounted to the transducer array 104 with a closed cell acrylic foam tape (e.g., 3M™ VHB™ tapes, or the like) that can tolerate long term exposure to temperatures around 200° F. In addition to bond formation, the closed cell acrylic foam can serve a second function by providing a compliant layer that distributes compressive mounting pressure evenly among the piezoelectric transducers 214 and allows them to seat against the gear without over constraining them.

FIG. 2B schematically illustrates a cross-sectional view of a stack up of the detection device 102, using a single transducer 214g to facilitate explanation. Each of the piezoelectric transducers 214 is electrically coupled to a ground plane flexible circuit 217 that carries ground traces to all piezoelectric transducers 214. The ground plane flexible circuit 217 can be a single layer, double sided flexible circuit. A first side of the ground plane flexible circuit 217 contacts a surface 240 of a gear stem 302 with or without a dry couplant 261 and a second side of the ground plane flexible circuit 217 includes multiple pads for mounting the piezoelectric transducers 214 thereto to make electrical and mechanical connection to the ground plane flexible circuit 217. The piezoelectric transducers 214 can be soldered to the ground plane flexible circuit 217 using solder preforms that can be reflowed. In some embodiments, the piezoelectric transducers 214 are electrically coupled to the ground plane flexible circuit 217 via a first conductive material 251 (e.g., solder, stiff and/or thin conductive epoxy, for example, a silver epoxy. etc.) applied on a pad 250 of the ground plane flexible circuit 217 or applied on a surface of the piezoelectric transducers 214 contacting the pad 250. The piezoelectric transducers 214 are also electrically coupled to a signal flexible circuit 216 that carries sensor and actuator traces to activate the piezoelectric transducers 214 for data collection and to transmit signals to the connector 222. The signal flexible circuit 216 can be a single sided or double sided multiple layer flexible circuit (e.g., four-layer flexible circuit) with sensor and actuator traces routed on layers separated by a full shield layer to protect signal integrity. In some embodiments, the piezoelectric transducers 214 are electrically coupled to the signal flexible circuit 216 via a second conductive material 252 (e.g., soft and/or thick conductive adhesive, etc.) applied on a pad 260 of the signal flexible circuit 216 or applied on a surface of the piezoelectric transducers 214 contacting the pad 260. The first conductive material 251 can have a thickness less than the second conductive material 252 for efficient ultrasound energy transfer between the gear stem 302 and the piezoelectric transducers 214. The second conductive material 252 having a greater thickness can direct the ultrasound energy into the gear stem 302 and reduce the energy going into the mounting plate 105 or other directions. In some embodiments, the first conductive material 251 and the second conductive material 252 can have the same thickness but different stiffness. For example, the first conductive material 251 has a first stiffness and the second conductive material 252 has a second stiffness. The first stiffness is greater than the second stiffness such that wave energy directed to the one or more mechanical components is easier than going into the mounting plate. It should be understood that the number of layers of the signal flexible circuit 216 and the number of layers of the ground plane flexible circuit 217 are not limited to the above values, but can be determined based at least in part on the number of the piezoelectric transducers 214 and suitable design requirements.

Figure 2C:
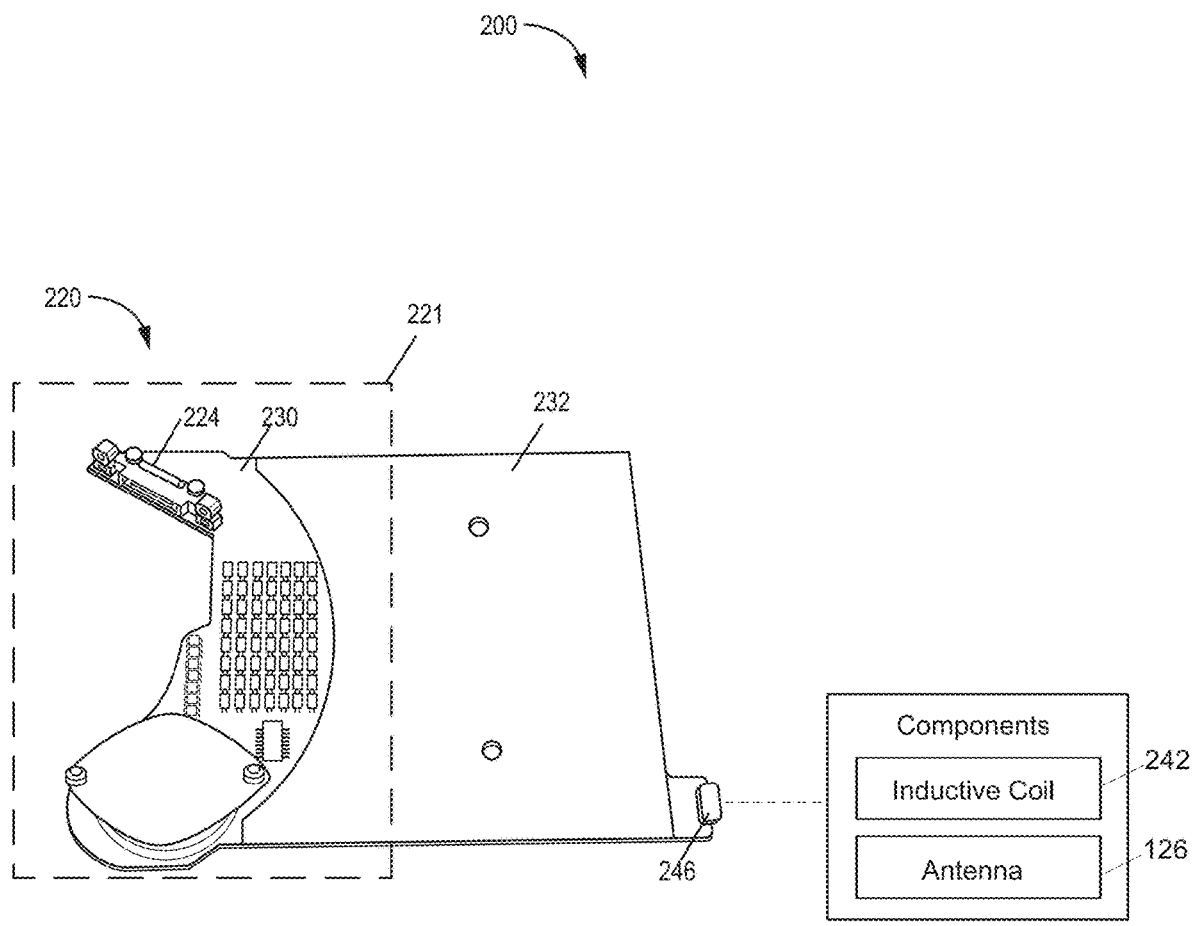
FIG. 2C illustrates an example printed circuit board of the example system according to some embodiments of the present disclosure.

FIG. 2C illustrates a printed circuit board 220 of the example system 200 according to some embodiments of the present disclosure. The printed circuit board 220 includes interface circuitry 130A of the system 120 and/or processing circuity components 106-116 of the system 120' for data acquisition, data processing, data transmission, power supply, power harvesting, power recharging, and/or other suitable operations. The flexible circuit 216 (shown in FIG. 2B) can be used to connect the connector 222 in FIG. 2A and the connector 224 in FIG. 2C such that the detection device 102 can transmit detected signals/data to the printed circuit board 220 for analysis and/or receive signals and/or instructions (e.g., selections for sensors and actuators, activation signals, etc.) from the printed circuit board 220. An inductive coil 242 (e.g., a receiving coil) and an antenna 126 (e.g., a BLE antenna) for power distribution and data transmission. The inductive coil 242 and the antenna 126 can be mounted on a flexible circuit that is electronically coupled to power traces and receive or transmit traces internal to the printed circuit board 220 via a port 246. Components are located on inboard sides 230 of the printed circuit board 220 and there are no traces on the outer layers in a region 232.

In embodiments that include a tail gearbox, for example, a gearbox for a tail of a helicopter, the region 232 serves as a tail rotor wear plate in place of a conventional wear plate. The printed circuit board 220 has the same thickness as a tail rotor wear plate and replaces that wear plate for installation. The inductive coil 242 and the antenna 126 can be bonded to the tail rotor itself. A removable neoprene boot that is normally installed on the rotor blade can provide additional protection for the inductive coil 242 and the antenna 126.

In some embodiments, the antenna 126 can transmit at least ten feet (and as far as thirty feet) through non-conducting materials, and the inductive power transfer can operate through at least 0.25 inches (and up to 0.75 inches) of any non-metallic material. In some embodiments, an inductive power transmission coil can be placed in close proximity to the inductive coil 242, and subsequently data can be transferred over BLE to a custom or off the shelf processing unit (e.g., processing circuitry of the printed circuit board 220 or a computing device). The transmission coil can be held by hand, slid into a mating receptacle/pouch, or mounted on a flexible strap outside the gearbox. The printed circuit board 220 can wirelessly transmit data to a nearby computing device (e.g., tablet, mobile/smart device, laptop, computer, custom-build processor, server, etc.). The transmission coil can be powered directly from the same computing device, or have its own attached rechargeable battery. The system 200 can have a built-in cybersecurity feature that the system 200 can only operate and transmit while the inductive coils are in close proximity, thus there is no possible risk outside a small distance range defined by the inductive coils.

Figure 3:
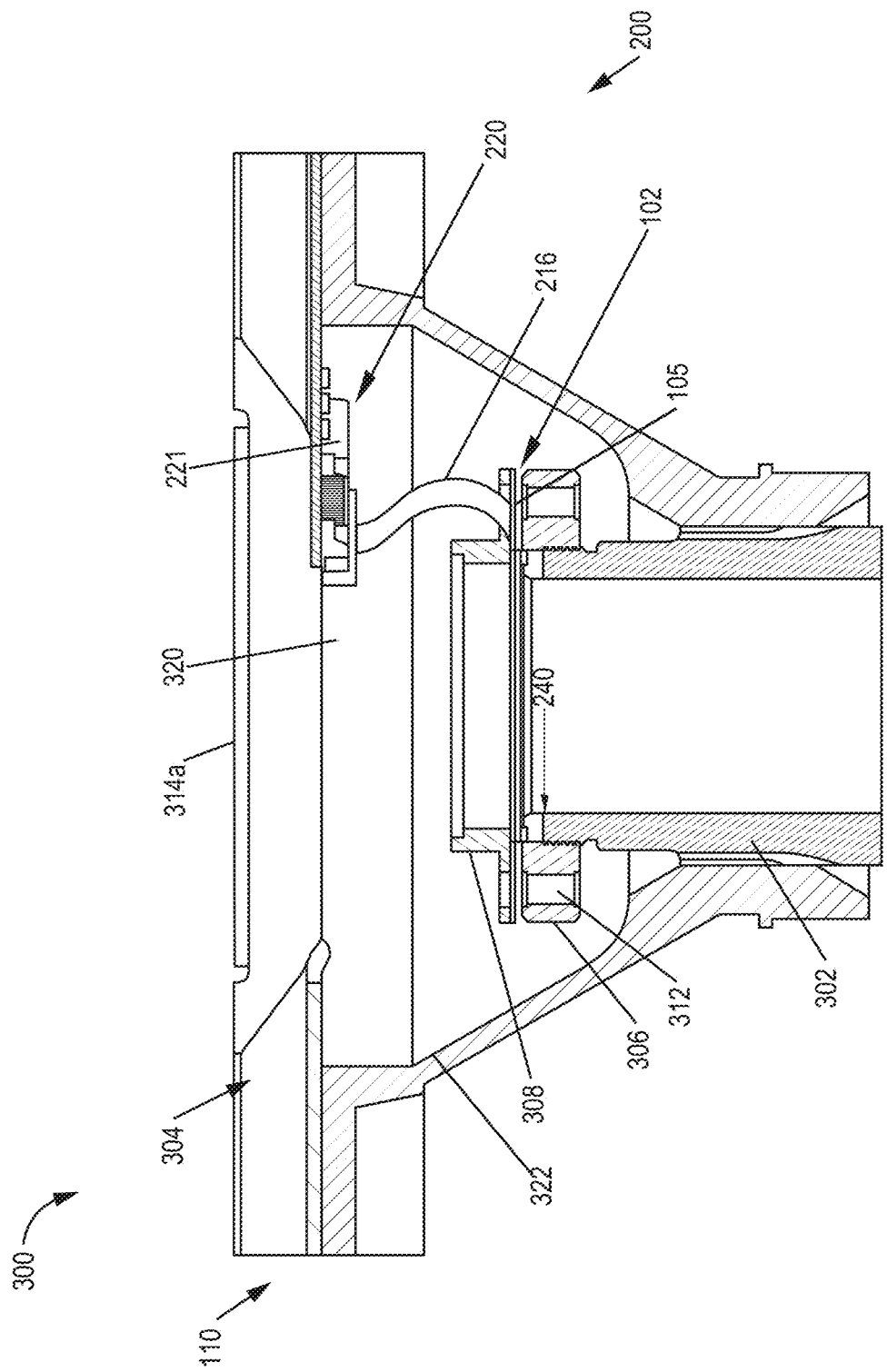
FIG. 3 is a cross-sectional view of an example rotorcraft tail gearbox integrated with the example system of FIG. 2.
Figure 4A:
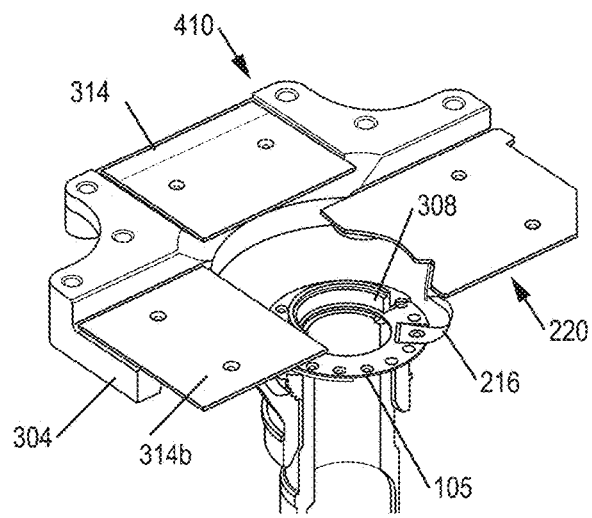
FIG. 4A is a cutaway view of the integrated rotorcraft tail gearbox of FIG. 3.
Figure 4B:
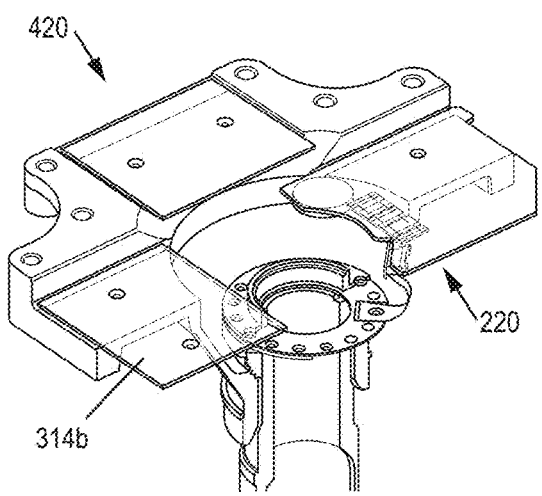
FIG. 4B is a cutaway view of the integrated rotorcraft tail gearbox of FIG. 3 with transparent views of a wear plate of the example rotorcraft tail gearbox and a substrate of the printed circuit board.
Figure 4C:
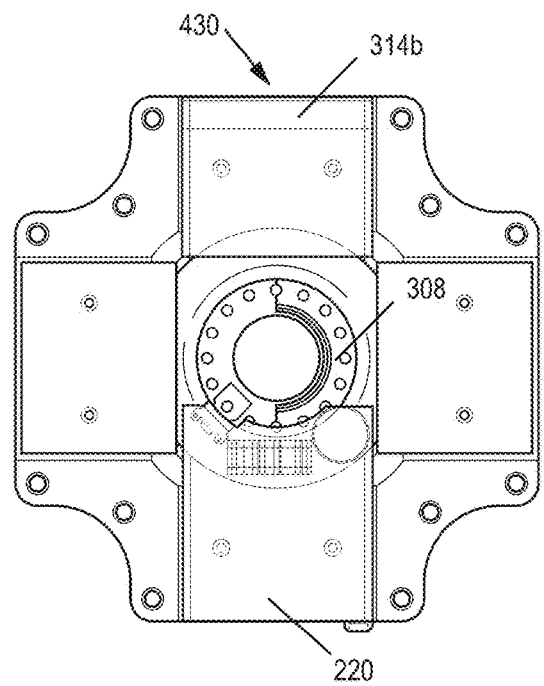
FIG. 4C is a top view of the integrated rotorcraft tail gearbox of FIG. 3 with transparent views of the wear plate and the printed circuit board and a cutaway of a scraper seal of the example rotorcraft tail gearbox.
Figure 5:
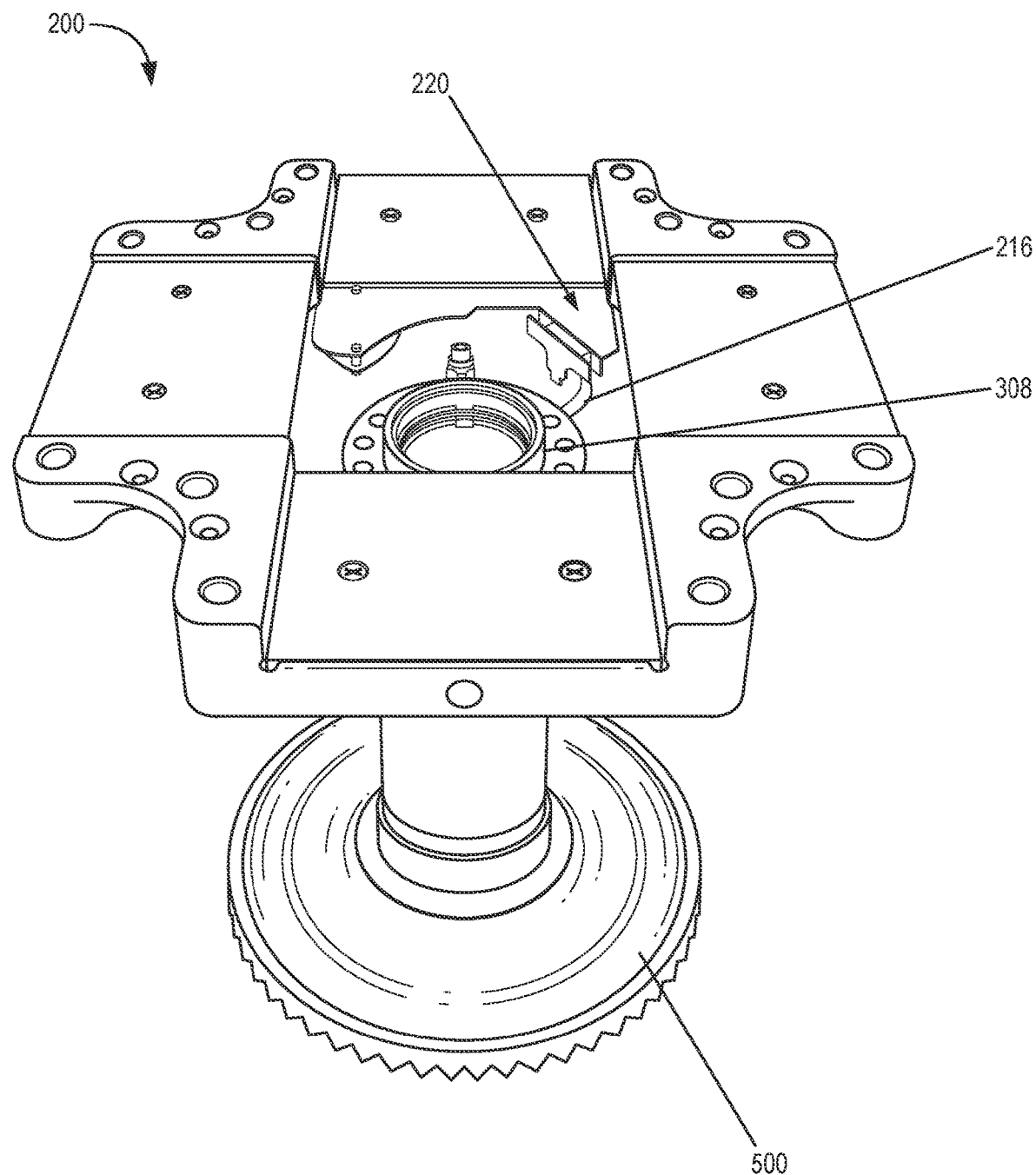
FIG. 5 illustrates the example tail gearbox of FIG. 3 with the example system of FIG. 2 installed.

FIG. 3 is a cross-sectional view 300 of a rotorcraft tail gearbox 110 (hereinafter referred to as "gearbox 110") integrated with the example system 200 of FIG. 2. FIG. 4A is a cutaway view 410 of the integrated rotorcraft tail gearbox of FIG. 3. FIG. 4B is a cutaway view 420 of the integrated rotorcraft tail gearbox with transparent views of the printed circuit board 220 and a wear plate 314*b* (shown in FIG. 4A) of the rotorcraft tail gearbox 110. FIG. 4C is a top view 430 of the integrated rotorcraft tail gearbox with transparent views of the wear plate 314*b* and the printed circuit board 220 and a cutaway of a scraper seal 308 of rotorcraft tail gearbox 110. FIG. 5 illustrates the tail gearbox 110 with the system 200 installed.

Figure 9A:
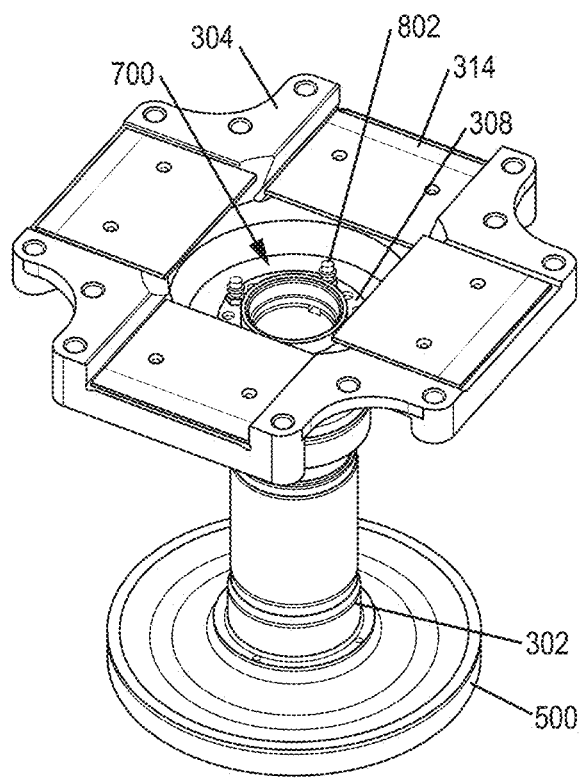
FIG. 9A is a perspective view of the integrated rotorcraft tail gearbox of FIG. 8A.
Figure 9B:
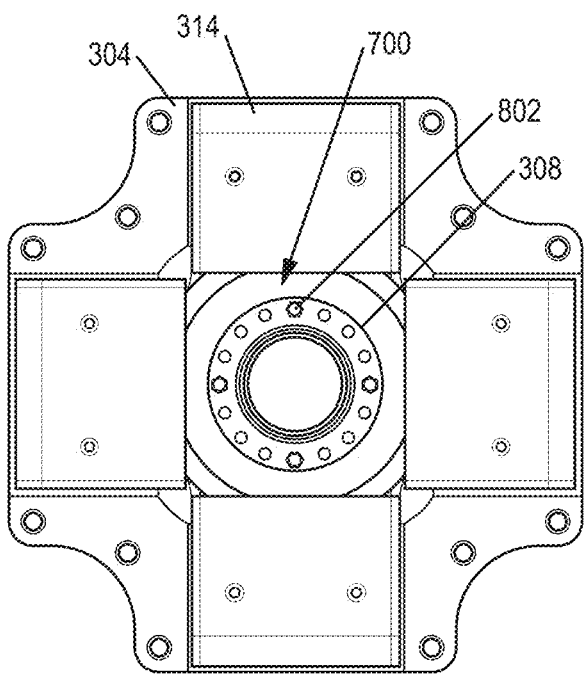
FIG. 9B is a top view of the integrated rotorcraft tail gearbox of FIG. 8A.

The gearbox 110 includes a gear (e.g., a bevel gear 500 in FIG. 5) with a gear stem 302, which may be hollow or solid, a retention plate 304, and mounting hardware components (e.g., a nut 306 having multiple holes 312 on a flange thereof (e.g., taped holes) and a scraper seal 308, bolts (as shown in FIGS. 8, 9A and 9B). The retention plate 304 can be configured to retain mechanical components (e.g., tail, propeller blades, etc.). The nut 306 is located at an outboard end (e.g., opposite to the end having the bevel gear) of the stem 302. Multiple bolts (e.g., bolts 802 in FIGS. 8, 9A and 9B) can pass through holes of the scraper seal 308 and the apertures of the mounting plate 105 of the detection device 102 and holes 312 of the nut 306 to secure the detection device 102 inside the gearbox 110. An outboard face of the nut 306 is roughly flush with an outboard face of the mounting plate 105. The bevel gear's outboard surface interfaces with the system 200 for inspecting or monitoring the gear stem 302 and gear 500 for defects. The detection device 102 is located between the nut 306 and the scraper seal 308. The detection device 102 is in intimate contact with an outboard surface 240 of the gear stem 302 for wear and defect detection. The detection device 102 is connected to the printed circuit board 220 via a flexible circuit 216 for communication (e.g., transmitting and/or receiving data/signals/instructions). In some embodiments, the inside of the gearbox 110 includes a toroidal volume 320 defined by the inside wall surfaces 322 of the gearbox 110. The circuitry 221 of the printed circuit board 220 is located within the volume 320. The printed circuit board 220 has a size and a thickness that matches a tail rotor wear plate 314*a* (shown in FIG. 3). In some embodiments, one of four wear plates is replaced by the printed circuit board 220 that can be fastened in place with the original wear plate fasteners. In some embodiments, a thinner wear plate may cover the printed circuit board 220. As shown in the cutaway view 420 in FIG. 4B and the top view 430 in FIG. 4C, components are located on the inboard side of the printed circuit board 220 and there are no traces on the outer layers in a region served as a wear plate to protect the traces and circuitry from wear or damage.

Figure 6:
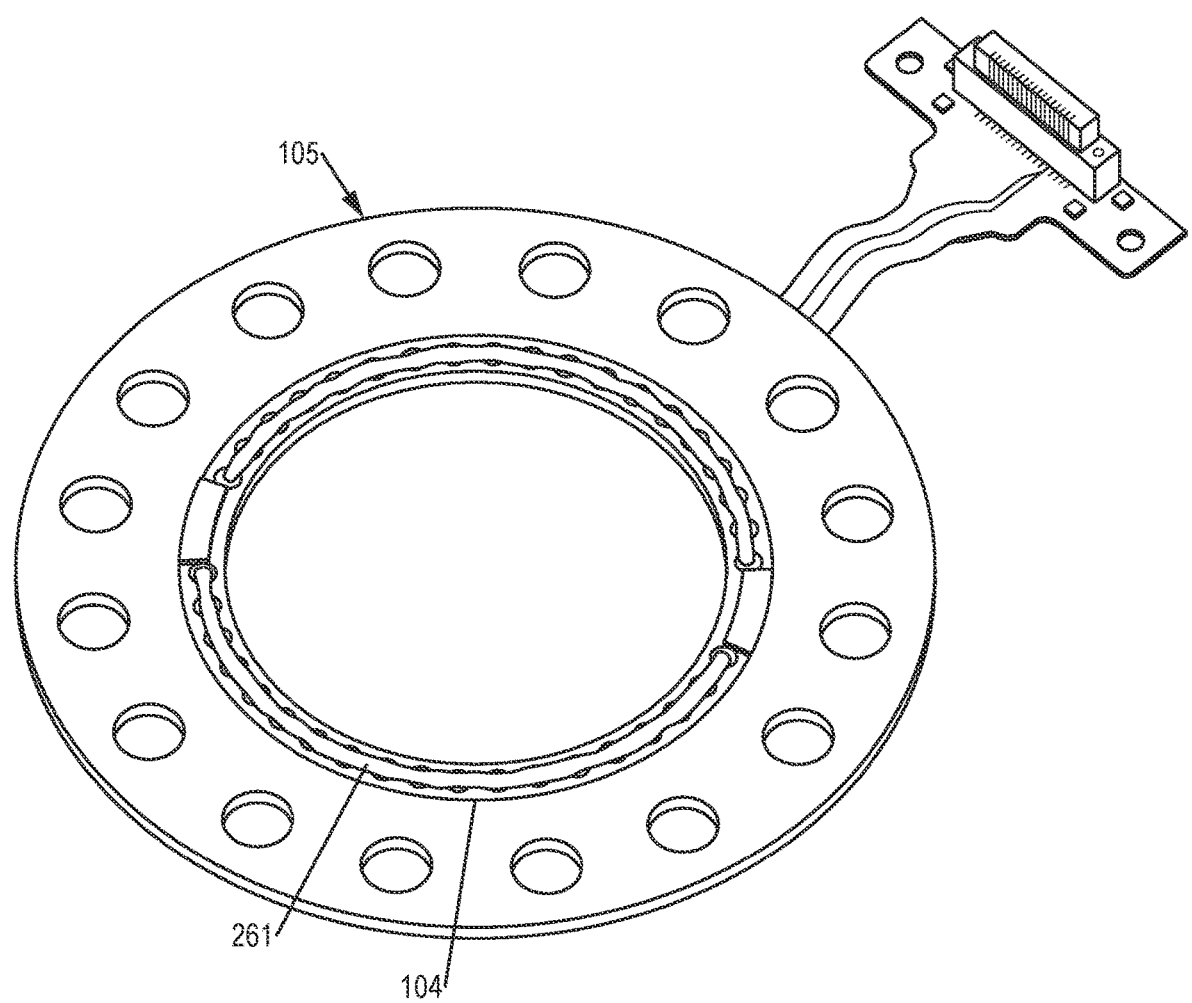
FIG. 6 illustrates a dry couplant is applied to the example system of FIG. 2.

FIG. 6 illustrates a form in place dry couplant 261 that assists in coupling wave energy generated by the transducer array 104 into the gear 500 (shown in FIG. 5) for inspection and evaluation. The form in place dry couplant 261 forms overtime once placed between the gear stem surface 240 (as shown in FIG. 3) and the surface of the pad 250. The dry couplant 261 can be formed from, for example, polyvinyl siloxane (PVS), or other suitable semi-permanent casting material. Over time, the dry couplant 261 hardens into a semi-permanent, but removable, interface that cures under load. The dry couplant 261 reduces reflection losses and acoustic absorption loss between the transducer array 104 and the gear stem surface 240.

Figure 7B:
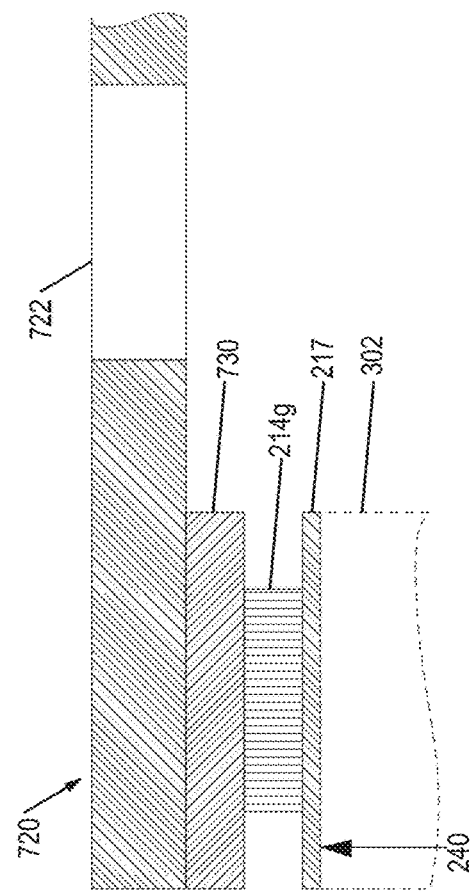
FIG. 7B pa cross-sectional view of the example system of FIG. 7A.
Figure 7A:
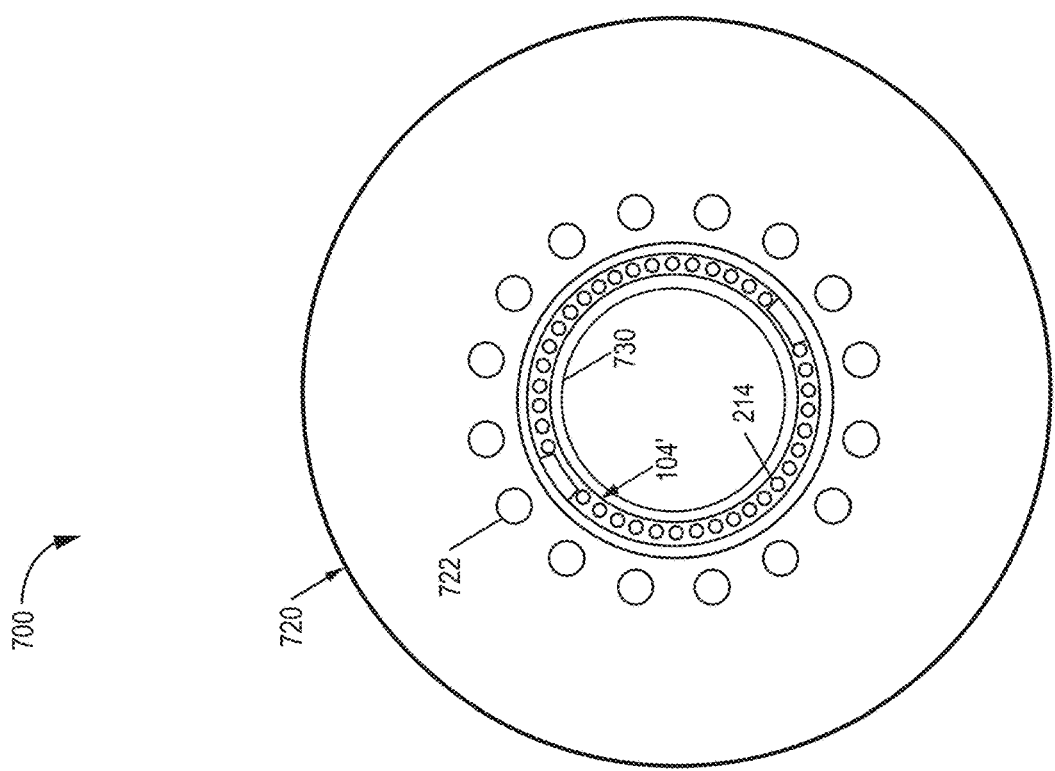
FIG. 7A illustrates a top view of another example system for in-situ monitoring of a rotorcraft tail gearbox according to some embodiments of the present disclosure.

FIG. 7A illustrates a top view of another example in-situ monitoring system 700 (hereinafter referred to as "system 700") for in-situ monitoring of a rotorcraft tail gearbox according to some embodiments of the present disclosure.

The system 700 includes a transducer array 104' (e.g., one of embodiments of the transducer array 104 in FIG. 1), a printed circuit board 720 (e.g., one of embodiments of the mounting plate 105 in FIG. 1) for implementing the interface circuitry 130A, the processing circuity 130B or both, and one or more interposers 730 that serve as an electrical interface routing between one connection to another. In some embodiments, the system 700 can be formed without the interposers 730. The interposer 730 is an intermediate printed circuit board (PCB) with one or more pads on both sides of the printed circuit board 720. The interposer 730 can be used to make a pad layout in one configuration match a pad layout in another configuration. For example, one side of the interposer can have a pad layout that matches the pinout of a chip and the second side of the interposer can have a pad layout that matches the PCB. Internal to the interposer are conductive traces that match the outputs and inputs of the pad layout in the first configuration to corresponding inputs and outputs of the pad layout in the second configuration. The interposer 730 and also serve as a spacer to compensate for height differences in some designs and layouts and can have the same pad layout on both sides or different pad layouts on each side depending on the application. The transducer array 104' has multiple circular piezoelectric transducers 214. The distribution of the piezoelectric transducers 214 can be similar to or the same as the transducer array 104. The printed circuit board 720 can also mount the system 700 into a gearbox through multiple apertures 722 of the printed circuit board 720. Examples of integrating the system 700 into the gearbox 110 are described with respect to FIGS. 8, 9A and 9B.

FIG. 7B schematically illustrates a cross-sectional view of an example stack up of the printed circuit board 720, one (e.g., the transducer 214g) of the piezoelectric transducers 214, the ground plane flexible circuit 217, an interposer 730 and the system 700 of FIG. 7A. FIG. 7B illustrates the stack up for a single piezoelectric transducer to facilitate explanation. The remaining piezoelectric transducers 214 forming the transducer array 104 have the same stack up. Each of the piezoelectric transducers 214 are electronically coupled to the ground plane flexible circuit 217 that is in contact with the surface 240 of the gear stem 302. Compared with the transducer array 104 in FIG. 2B, the mechanical coupling between the piezoelectric transducers 214 of the transducer array 104' and the ground plane flexible circuit 217 is similar, but the transducer array 104' is soldered directly onto the printed circuit board 720 without using a signal flexible circuit (e.g., the signal flexible circuit 216 having the connector 222) to connect to the printed circuit board 720. The printed circuit board 720 can also mount the system 700 into a gearbox through multiple apertures 722 of the printed circuit board 720.

FIG. 8A is a cross-sectional view of the rotorcraft tail gearbox 110 integrated with the system 700. FIG. 8B is a zoomed-in view of a portion of FIG. 8A. FIG. 8C is a zoomed-in view of a portion of FIG. 8B. FIG. 9A is a perspective view of the integrated rotorcraft tail gearbox of FIG. 8A. FIG. 9B is a top view of the integrated rotorcraft tail gearbox of FIG. 8A.

Compared with the system 200, the transducer array 104' of the system 700 is soldered to the printed circuit board 720 through two interposers 730, instead of using a flexible circuit (e.g., the flexible circuit 216 in FIG. 3) to connect to the printed circuit board 720. The system 700 is placed between the nut 306 and the scraper seal 308. The printed circuit board 720 takes the place of the flexible circuit 216 and the printed circuit board 220. As such, the printed circuit board 720 includes an area that extends beyond the outer diameter of the nut 306 to mount and electrically couple one or more components or devices to the transducer array 104. This also avoids the need to replace a wear plate with a PCB as described above in relation to FIG. 3. Multiple bolts 802 pass through holes of the scraper seal 308 and the apertures 722 of the printed circuit board 720 and holes 312 of the nut 306 to secure the system 700 inside the gearbox 110.

Figure 10:
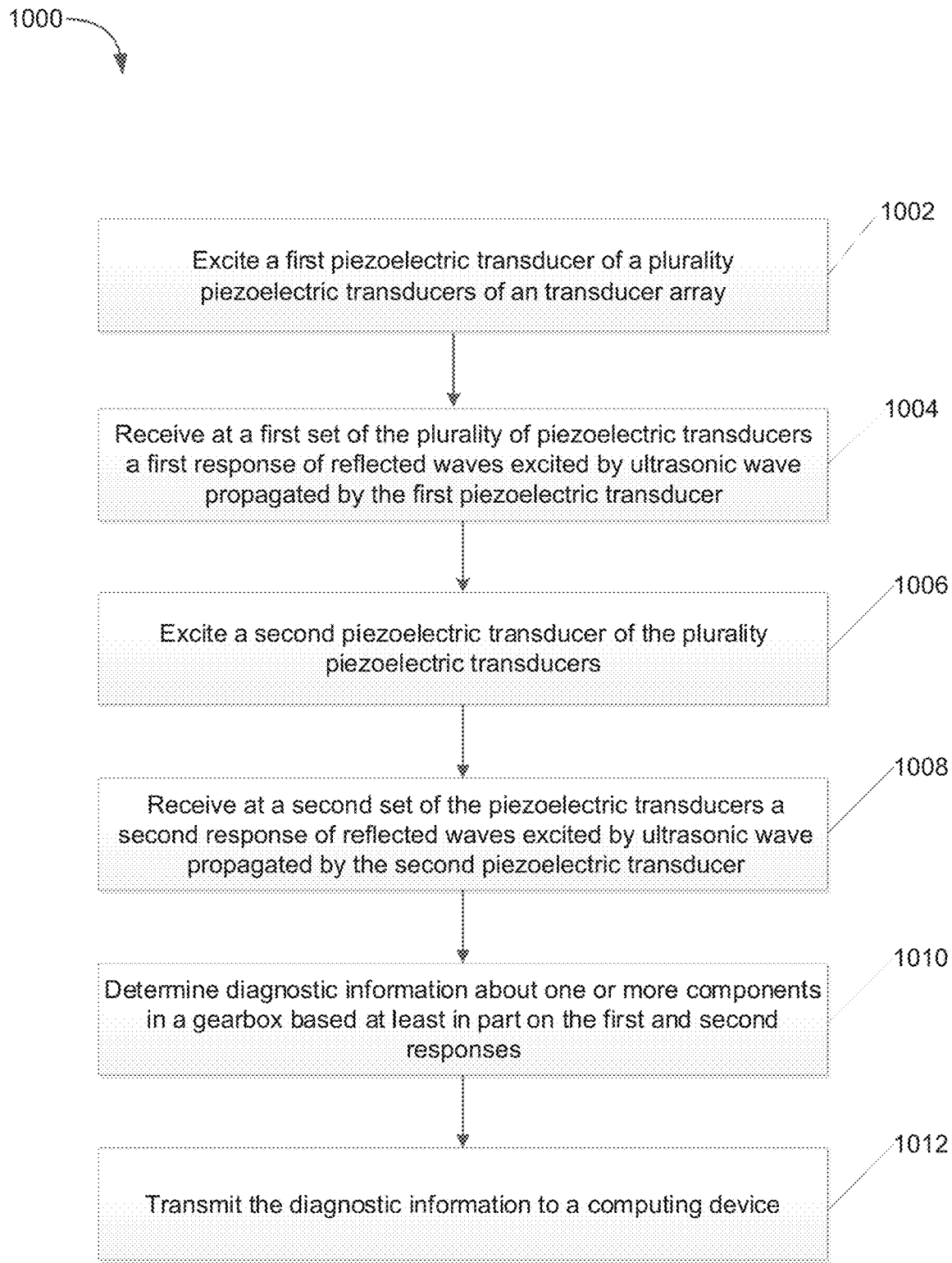
FIG. 10 is a flowchart illustrating processing steps of a method for in-situ monitoring of a gearbox carried out by an example system according to some embodiments of the present disclosure.

FIG. 10 is a flowchart illustrating processing steps of a method 1000 for in-situ monitoring of the gearbox 110 as carried out by the system 120 (and/or 120') according to some embodiments of the present disclosure. In step 1002, the system 120 (and/or 120') excites a first piezoelectric transducer of the plurality piezoelectric transducers of the transducer array 104. For example, the processing device 116 or a processing device located external to the gearbox 110 can instruct the excitation source 107 to excite the first piezoelectric transducer. The first piezoelectric transducer can serve as an actuator to send a signal (e.g., a ultrasound wave, vibrational wave, etc.).

In step 1004, the system 120 (and/or 120') receives at a first set of the plurality of piezoelectric transducers a first response of reflected waves excited by the ultrasonic wave propagated by the first piezoelectric transducer. For example, the system 120 (and/or 120') receives a wave signal reflected from one or more components of the gearbox 110 via neighboring piezoelectric transducers to the first piezoelectric transducer. The neighboring piezoelectric transducers can serve as sensors. In some embodiments, the neighboring piezoelectric transducers can be substantially evenly distributed on each side of the first piezoelectric transducer. For example, using "A" for actuator and "S" for sensor, sensors are distributed on each side of the first piezoelectric transducer as follows: [S-S-S-A-S-S-S]. In some embodiments, the neighboring piezoelectric transducers can be unevenly distributed on each side of the first piezoelectric transducer. For example, sensors are distributed on each side of the first piezoelectric transducer as follows: [S-S-A-S-S-S]. For example, as shown in FIG. 2A, if a piezoelectric transducer 214h is excited, the system 200 receives responses from piezoelectric transducers 214a, 214i, 214k, 214b, 214j, and 214l. In some embodiments, the system 200 can also receive signals from the excited piezoelectric transducer 214h. It should be understood that the number of sensors on each side of an excited piezoelectric transducer is not limited to the above example, but can be determined based on particular components to be monitored and/or based on a user input or is randomly determined. For example, if bolts passing through the apertures (e.g., apertures 218 in FIG. 2A or 7A) of the mounting plate 105 are monitored, the number of sensors are determined by an interval distance between two neighboring apertures/bolts. For a particular bolt, a piezoelectric transducer in front of that bolt can be excited and piezoelectric transducers distributed on each side of the excited piezoelectric transducers can receive a response reflected from that bolt.

In step 1006, the system 120 (and/or 120') excites a second piezoelectric transducer of the plurality piezoelectric transducers. For example, the processing device 116 can instruct the excitation source 107 to excite the second piezoelectric transducer. In some embodiments, the second piezoelectric transducer can be directly next to the outermost sensor relative to the first piezoelectric transducer or directly next to the first piezoelectric transducer. The second piezoelectric transducer can be excited subsequent to the first piezoelectric transducer. Continuing to the above examples, the second piezoelectric transducer can be distributed as follows {S-S-S-A'-[S-S-S]-A-S-S-S] or [S-S-S-A-{S-S-S]-A'-S-S-S}. In some embodiments, after the sensors receive reflected signals caused by the first piezoelectric transducer, a piezoelectric transducer next to the first piezoelectric transducer, which previously served as a sensor, can be excited to become an actuator. The first piezoelectric transducer, previously served as an actuator, can be used as a sensor to receive reflected signals caused by the second piezoelectric transducer. In some embodiments, the first and second piezoelectric transducer can be simultaneously excited. The sensors for each excited piezoelectric transducer can simultaneously detect reflected signals.

In step 1008, the system 120 (and/or 120') receives at a second set of the plurality of piezoelectric transducers a second response of reflected waves excited by ultrasonic wave propagated by the second piezoelectric transduce. For example, the system 120 (and/or 120') receives a wave signal reflected from one or more components of the gearbox 110 via neighboring piezoelectric transducers to the second piezoelectric transducer. In some embodiments, the neighboring piezoelectric transducers can be evenly distributed on each side of the second piezoelectric transducer. In some embodiments, the neighboring piezoelectric transducers can be unevenly distributed on each side of the second piezoelectric transducer. The number of sensors on each side of the second piezoelectric transducer can predetermined based on particular components to be monitored and/or based on a user input.

In some embodiments, the in-situ diagnostics is limited to the excitation of a single piezoelectric transducer. In some embodiments, the in-situ diagnostics is limited to the excitation of two piezoelectric transducers. In some embodiments, the in-situ diagnostics is not limited to the excitation of two piezoelectric transducers or limited to the excitation of a single piezoelectric transducer. In some embodiments, the in-situ diagnostics excites each piezoelectric transducers in the array. One skilled in the art will recognize the illustration of steps 1002, 1004, 1006, and 1008 are illustrative and meant to facilitate explanation of the example in-situ diagnostics systems taught herein. As such, the method 1000 can include additional or fewer excitation and receiving steps based on the number of piezoelectric transducers selected to excite.

In step 1010, the system 120 (and/or 120') determines diagnostic information about one or more components in the gearbox 110 based at least in part on the first or second or both responses. The diagnostic information relates to fatigue cracks, corrosion, level of bolt torque, and/or imbalance. In some embodiments, the processing device 116 can compare the responses with one or more references (e.g.,. historical responses, a lookup table, threshold values, safety standards, etc.) to determine if an abnormal condition (e.g., crack, corrosion, damage and/or imbalance) for a particular component of the gearbox 110 occurs, such as the responses do not satisfy the threshold values and/or safety standards, are not consistent with historical responses, match abnormal conditions defined in the lookup table, and/or do not match normal conditions defined in the lookup table.

In step 1012, the system 120 (and/or 120') transmits the diagnostic information to a computing device external to the gearbox. For example, the system 120 (and/or 120') wirelessly transmits the diagnostic information to the computing device(s) 150 without having to open the gearbox. In some embodiments, the computing device(s) 150 can be part of the system 120 (and/or 120'). The computing device(s) 150 can be used to determine the diagnostic information as described in step 1010.

Those skilled in the art will appreciate that the principal of exciting one or more of the plurality of piezoelectric transducers in the array and receiving a reflected wave at one or more of the other transducers in the array described above in steps 10004-1012 is equally applicable to all embodiments taught herein.

In some embodiments, the system 120 (and/or 120') can utilize the transducer array 104 as a beamforming phased array, and in other cases the transducer array 104 can be used one at a time and/or in "pitch-catch" pairs as described above.

It should be understood that the operations and processes described above and illustrated in the figures can be carried out or performed in any suitable order as desired in various implementations. Additionally, in certain implementations, at least a portion of the operations can be carried out in parallel. Furthermore, in certain implementations, less than or more than the operations described can be performed.

Figure 11:
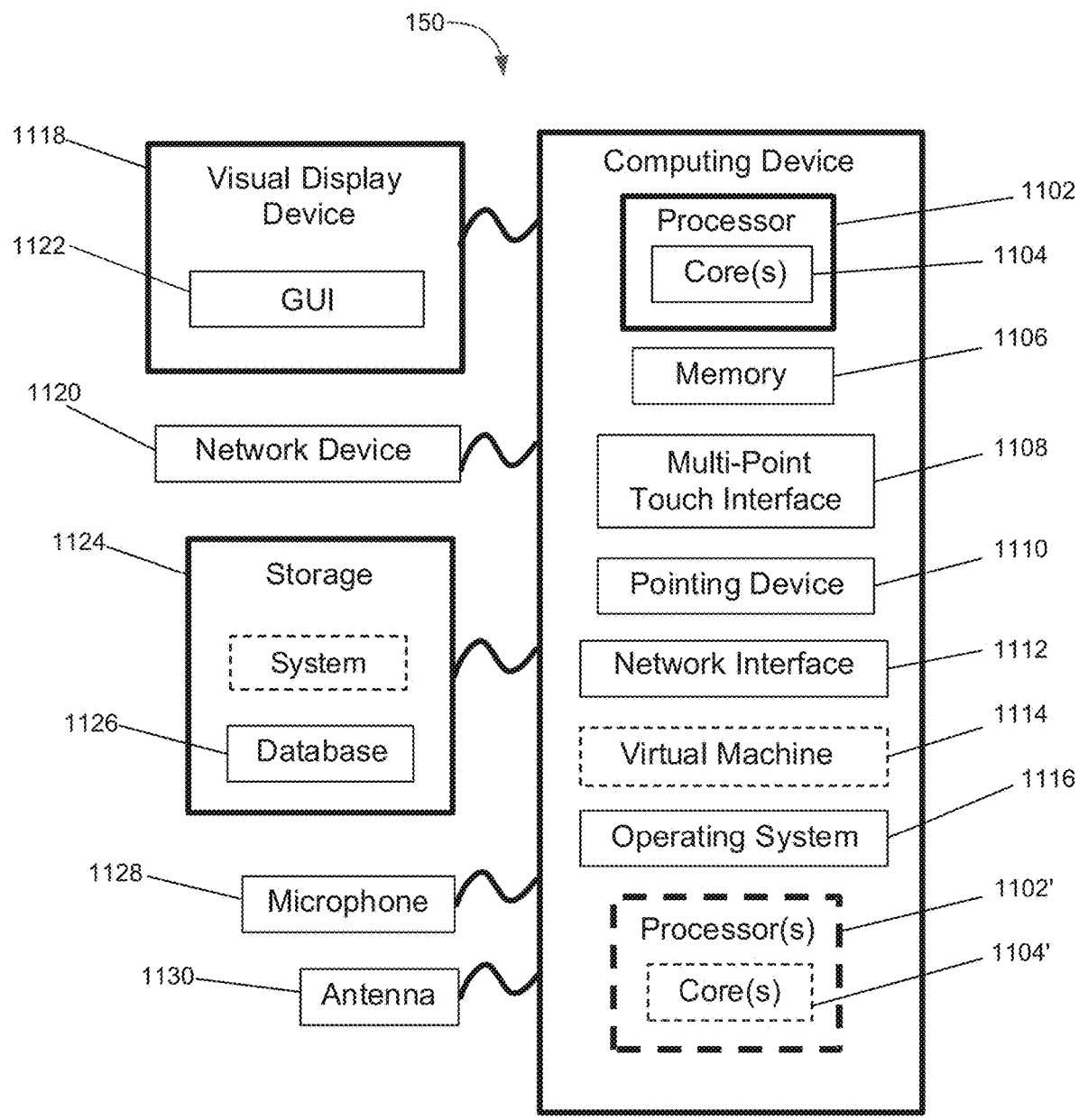
FIG. 11 is a block diagram of an example computing device that can be used to perform one or more steps of the methods provided by example embodiments.

FIG. 11 is a block diagram of an example computing device 150 that can be used to perform one or more steps of the methods provided by example embodiments. The computing device 150 includes one or more non-transitory computer-readable media for storing one or more computer-executable instructions or software for implementing example embodiments. The non-transitory computer-readable media can include, but are not limited to, one or more types of hardware memory, non-transitory tangible media (for example, one or more magnetic storage disks, one or more optical disks, one or more USB flashdrives), and the like. For example, memory 1106 included in the computing system 150 can store computer-readable and computer-executable instructions or software for implementing example embodiments. The computing device 150 also includes processor 1102 and associated core 1104, and optionally, one or more additional processor(s) 1102' and associated core(s) 1104' (for example, in the case of computer systems having multiple processors/cores), for executing computer-readable and computer-executable instructions or software stored in the memory 1106 and other programs for controlling system hardware. Processor 1102 and processor(s) 1102' can each be a single core processor or multiple core (1104 and 1104') processor. The computing system 150 also includes a graphics processing unit (GPU) 1105. In some embodiments, the computing system 150 includes multiple GPUs.

Virtualization can be employed in the computing system 150 so that infrastructure and resources in the computing device can be shared dynamically. A virtual machine 1114 can be provided to handle a process running on multiple processors so that the process appears to be using only one computing resource rather than multiple computing resources. Multiple virtual machines can also be used with one processor.

Memory 1106 can include a computer system memory or random access memory, such as DRAM, SRAM, EDO RAM, and the like. Memory 1106 can include other types of memory as well, or combinations thereof. A user can interact with the computing device 150 through a visual display device 1118, such as a touch screen display or computer monitor, which can display one or more user interfaces 1119. The visual display device 1118 can also display other aspects, transducers and/or information or data associated with example embodiments. The computing device 150 can include other I/O devices for receiving input from a user, for example, a keyboard or any suitable multi-point touch interface 1108, a pointing device 1110 (e.g., a pen, stylus, mouse, or trackpad). The keyboard 1108 and the pointing device 1110 can be coupled to the visual display device 1118. The computing device 150 can include other suitable conventional I/O peripherals.

The computing device 150 can also include one or more storage devices 1124, such as a hard-drive, CD-ROM, or other computer readable media, for storing data and computer-readable instructions, applications, and/or software that implements example operations/steps of the system (e.g., the system 120, the system 120', the system 200, the system 700) as described herein, or portions thereof, which can be executed to generate user interface 1119 on display 1118. Example storage device 1124 can also store one or more databases for storing any suitable information required to implement example embodiments. The databases can be updated by a user or automatically at any suitable time to add, delete or update one or more items in the databases. Example storage device 1124 can store one or more databases 1126 for storing provisioned data, and other data/information used to implement example embodiments of the systems and methods described herein.

The steps for carrying out an in-situ inspection of a gearbox as taught herein may be embodied as an executable program, such as an in-situ inspection application and stored in the storage 1124 and the memory 1106. The executable program can be executed by the processor to perform the in-situ inspection as taught herein.

The computing device 150 can include a network interface 1112 configured to interface via one or more network devices 1122 with one or more networks, for example, Local Area Network (LAN), Wide Area Network (WAN) or the Internet through a variety of connections including, but not limited to, standard telephone lines, LAN or WAN links (for example, 802.11, T1, T3, 56 kb, X.25), broadband connections (for example, ISDN, Frame Relay, ATM), wireless connections, controller area network (CAN), or some combination of any or all of the above. The network interface 1112 can include a built-in network adapter, network interface card, PCMCIA network card, card bus network adapter, wireless network adapter, USB network adapter, modem or any other device suitable for interfacing the computing device 150 to any type of network capable of communication and performing the operations described herein. Moreover, the computing device 150 can be any computer system, such as a workstation, desktop computer, server, laptop, handheld computer, tablet computer (e.g., the iPad® tablet computer), mobile computing or communication device (e.g., the iPhone® communication device), or other form of computing or telecommunications device that is capable of communication and that has sufficient processor power and memory capacity to perform the operations described herein.

The computing device 150 can run any operating system 1116, such as any of the versions of the Microsoft® Windows® operating systems, the different releases of the Unix and Linux operating systems, any version of the MacOS® for Macintosh computers, any embedded operating system, any real-time operating system, any open source operating system, any proprietary operating system, any operating systems for mobile computing devices, or any other operating system capable of running on the computing device and performing the operations described herein. In some embodiments, the operating system 1116 can be run in native mode or emulated mode. In some embodiments, the operating system 1116 can be run on one or more cloud machine instances.

Figure 12:
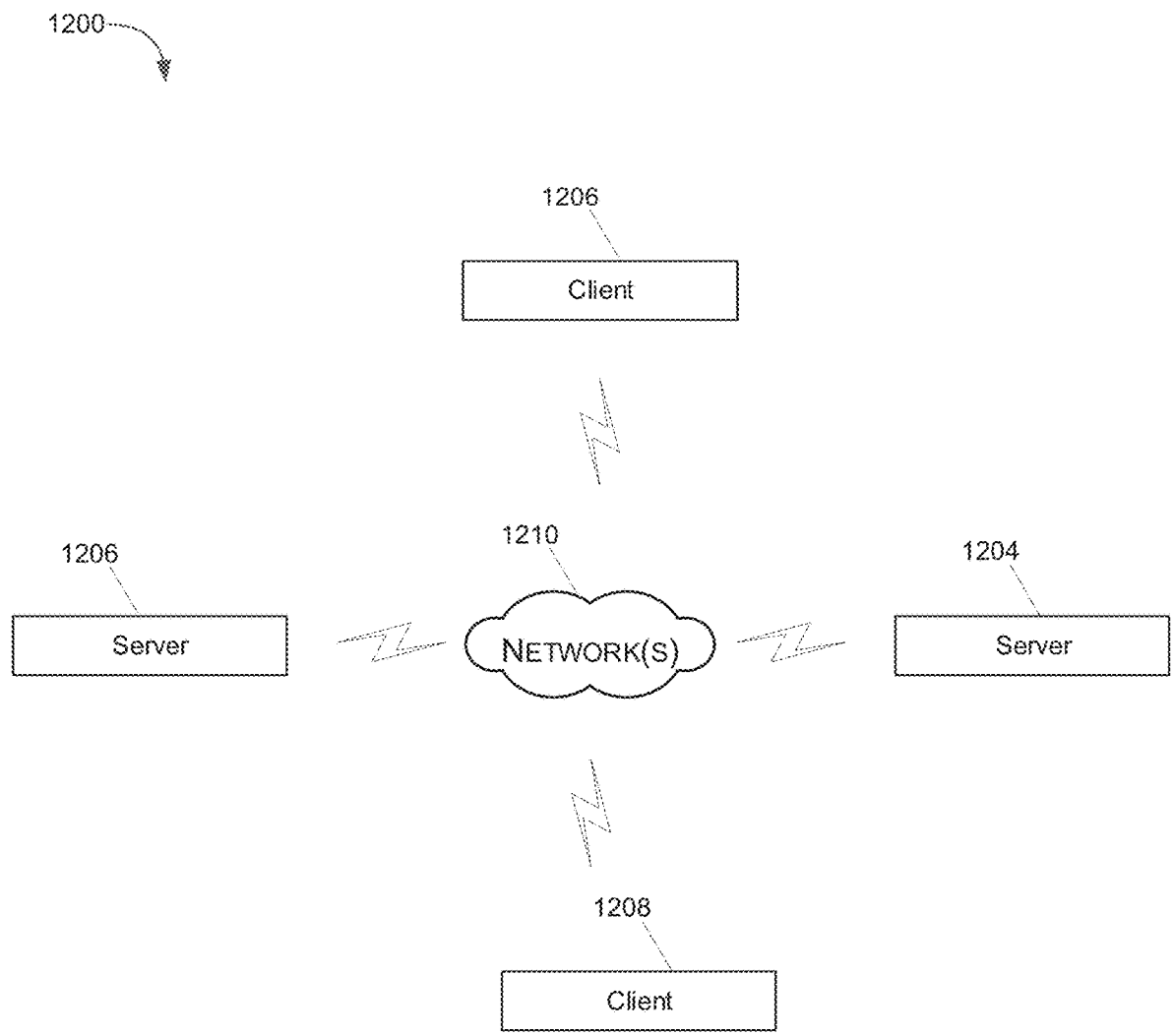
FIG. 12 illustrates an example network environment suitable for a distributed implementation of example embodiments.

FIG. 12 illustrates an example network environment 1200 suitable for a distributed implementation of example embodiments. The network environment 1200 can include one or more servers 1202 and 1204 coupled to clients 1206 and 1208 via a communication network 1210 (e.g., one of embodiments of the network(s) 140 in FIG. 1). In one implementation, the servers 1202 and 1204 or clients 1206 or 1208 can be implemented via the computing device 150. The network interface 820 of the computing device 150 enables the servers 1202 and 1204 to communicate with the clients 1206 and 1208 through the communication network 1210. The communication network 1210 can include Internet, intranet, LAN (Local Area Network), WAN (Wide Area Network), MAN (Metropolitan Area Network), wireless network (e.g., using IEEE 802.11 or Bluetooth), etc. In addition the network may use middleware, such as CORBA (Common Object Request Broker Architecture) or DCOM (Distributed Component Object Model) to allow a computing device on the network 1210 to communicate directly with another computing device that is connected to the network 1210.

In the network environment 1200, the servers 1202 and 1204 can provide the clients 1206 and 1208 with software components or products under a particular condition, such as a license agreement. The software components or products can include one or more components of the application that implements example embodiments of the system (e.g., the system 120, the system 120', the system 200) as described herein. For example, the client 1206 or 1208 can collect data which is subsequently communicated over the server 1202 or 1204 for processing.

In describing example embodiments, specific terminology is used for the sake of clarity. For purposes of description, each specific term is intended to at least include all technical and functional equivalents that operate in a similar manner to accomplish a similar purpose. Additionally, in some instances where a particular example embodiment includes multiple system elements, device components or method steps, those elements, components or steps may be replaced with a single element, component or step. Likewise, a single element, component or step may be replaced with multiple elements, components or steps that serve the same purpose. Moreover, while example embodiments have been shown and described with references to particular embodiments thereof, those of ordinary skill in the art will understand that various substitutions and alterations in form and detail may be made therein without departing from the scope of the present disclosure. Further still, other embodiments, functions and advantages are also within the scope of the present disclosure.

What is claimed is:

1. A system for in-situ monitoring of a gearbox, the system comprising:
   a mounting plate coupled to a component within the gearbox;
   a transducer array having a plurality of piezoelectric transducers disposed on the mounting plate in a circular pattern with a substantially evenly spaced gap between one or more of the plurality of piezoelectric transducers, the transducer array in contact with a surface of one or more mechanical components within the gearbox to ultrasonically obtain diagnostic information about the one or more mechanical components in the gearbox and the plurality of piezoelectric transducers being coupled to the mounting plate and the surface of the one or more mechanical components within the gearbox via materials of different thickness and/or stiffness in a manner to direct wave energy into the surface of the one or more mechanical components within the gearbox while attenuating the wave energy entering the mounting plate;
   circuitry, at least a portion of which is mounted inside the gearbox, electrically couplable to the transducer array, the circuitry configured to:
      direct an excitation signal to a selected piezoelectric transducer of the plurality of piezoelectric transducers; and
      direct a response received from one or more of the plurality of piezoelectric transducers in proximity to the selected piezoelectric transducer toward a processor programmed or configured to determine the diagnostic information about the one or more mechanical components based at least in part on the response received from the one or more of the plurality piezoelectric transducers.

2. The system of claim 1, wherein the portion of the circuitry comprises an analog signal conditioning circuit, a data acquisition device, a communication device, a power source or an excitation source.

3. The system of claim 1, wherein another portion of the circuitry is mounted outside of the gearbox including an analog signal conditioning circuit, a data acquisition device, a communication device, a power source or an excitation source.

4. The system of claim 1, further comprising:
   an antenna to receive or transmit one or more signals in a wireless protocol.

5. The system of claim 1, further comprising a first flexible circuit between the transducer array and the surface of one or more mechanical components within the gearbox, and a second flexible circuit between the transducer array and the mounting plate, wherein the first flexible circuit and the second flexible circuit are electrically coupled to the plurality of piezoelectric transducers and to the circuitry.

6. The system of claim 1, wherein the mounting plate is a printed circuit board electrically coupled to the circuitry.

7. The system of claim 6, further comprising a flexible circuit between the transducer array and the surface of the one or more mechanical components within the gearbox, wherein the flexible circuit is electrically coupled to the plurality of piezoelectric transducers and to the circuitry.

8. The system of claim 7, wherein a first side of each of the plurality of piezoelectric transducers is electrically coupled to a first side of the flexible circuit, a second side of the flexible circuit is in contact with the surface of the one or more mechanical components in the gearbox, a second side of each of the plurality of piezoelectric transducers is electrically coupled with the printed circuit board.

9. The system of claim 6, wherein a first side of each of the plurality of piezoelectric transducers is electrically coupled to the printed circuit board and a second side of each of the plurality of piezoelectric transducers is in contact with the surface of the one or more mechanical components in the gearbox.

10. The system of claim 7, wherein the plurality of piezoelectric transducers are electrically coupled to the flexible circuit with silver-loaded solder, epoxy or adhesive.

11. The system of claim 1, wherein the transducer array is in contact with the surface of the one or more mechanical components via a semi-permanent casting compound.

12. The system of claim 1, wherein the transducer array is in contact with the surface of the one or more mechanical components via a permanent adhesive or epoxy.

13. The system of claim 1, wherein the mounting plate includes a plurality of apertures disposed in a circular pattern about the mounting plate.

14. The system of claim 1, wherein the diagnostic information identifies at least one of a bolt torque, a crack or a torque balance for a plurality of fasteners within the gearbox.

15. The system of claim 1, wherein the circuitry is potted with urethane, conformal coating or soft epoxy to protect against fluids and mechanical loading.

16. The system of claim 1, further comprising:
   a receiver coil receiving power wirelessly from a transmitter coil via an inductive coupling.

17. A method for in-situ monitoring of a gearbox, the method comprising:
   exciting a first piezoelectric transducer of a plurality of piezoelectric transducers to propagate an ultrasonic wave in one or more mechanical components within the gearbox, the plurality of piezoelectric transducers disposed in a circular pattern on a mounting plate with a substantially evenly spaced gap between one or more of the plurality of piezoelectric transducers, the plurality of piezoelectric transducers in contact with a surface of the one or more mechanical components within the gearbox to obtain diagnostic information about the one or more mechanical components;
   receiving at a first set of the plurality of piezoelectric transducers a first response of reflected waves excited by the ultrasonic wave propagated by the first piezoelectric transducer;
   in response to receiving the first response of reflected waves, directing data through circuitry at least partially mounted inside the gearbox toward a processor programmed to or configured to determine diagnostic information about the one or more components in the gearbox based at least in part on the first response reflected waves;
   simultaneously or sequentially exciting additional piezoelectric transducers of the plurality of piezoelectric transducers to propagate additional ultrasonic waves in one or more mechanical components within the gearbox;
   receiving at additional sets of the plurality of piezoelectric transducers additional responses of reflected waves excited by the additional ultrasonic waves propagated by the additional piezoelectric transducers, and
   in response to receiving the additional responses of reflected waves, directing data toward the processor programmed to or configured to determine diagnostic information about the one or more components in the gearbox based at least in part on the additional responses of reflected waves.

18. The method of claim 17, further comprising:
receiving, by a receiver coil, power wirelessly from a transmitter coil via an inductive coupling.

19. The method of claim 17, further comprising:
receiving or transmitting, by an antenna, one or more signals in a wireless protocol.

20. The method of claim 17, further comprising,
providing the mounting plate having mounted thereto a transducer array formed by the plurality of piezoelectric transducers.

21. The method of claim 20, wherein the plurality of piezoelectric transducers are disposed between the mounting plate and the surface of the one or more mechanical components within the gearbox, and being coupled to the mounting plate and the surface of the one or more mechanical components within the gearbox via materials of differing thickness and/or stiffness in a manner to direct wave energy into the surface of the one or more mechanical components within the gearbox while attenuating the wave energy entering the mounting plate.

22. The method of claim 21, further comprising a first flexible circuit between the transducer array and the surface of one or more mechanical components within the gearbox, and a second flexible circuit between the transducer array and the mounting plate, wherein the first flexible circuit and the second flexible circuit are electrically coupled to the plurality of piezoelectric transducers and to the circuitry.

23. The method of claim 21, wherein the mounting plate is a printed circuit board electrically coupled to the circuitry.

24. The method of claim 23, further comprising a flexible circuit between the transducer array and the surface of the one or more mechanical components within the gearbox, wherein the flexible circuit is electrically coupled to the plurality of piezoelectric transducers and to the circuitry.

25. The method of claim 24, wherein a first side of each of the plurality of piezoelectric transducers is electrically coupled to the flexible circuit, and a second side of each of the plurality of piezoelectric transducers is electrically coupled with the printed circuit board.

26. The method of claim 23, wherein a first side of each of the plurality of piezoelectric transducers is electrically coupled to the printed circuit board and a second side of each of the plurality of piezoelectric transducers is in contact with the surface of the one or more mechanical components in the gearbox.

27. The method of claim 17, wherein the transducer array is in contact with the surface of the one or more mechanical components via a semi-permanent casting compound.

28. The method of claim 17, wherein the diagnostic information identifies at least one of a bolt torque, a crack or a torque balance for plurality of fasteners.

* * * * *